(12) United States Patent
Jang et al.

(10) Patent No.: US 12,464,846 B2
(45) Date of Patent: Nov. 4, 2025

(54) IMAGE SENSOR

(71) Applicant: Samsung Electronics Co., Ltd., Suwon-si (KR)

(72) Inventors: Minho Jang, Suwon-si (KR); Seungkuk Kang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 573 days.

(21) Appl. No.: 17/901,335

(22) Filed: Sep. 1, 2022

(65) Prior Publication Data

US 2023/0081238 A1  Mar. 16, 2023

(30) Foreign Application Priority Data

Sep. 13, 2021 (KR) .................. 10-2021-0122069

(51) Int. Cl.
 *H01L 21/02* (2006.01)
 *H01L 23/00* (2006.01)
 (Continued)

(52) U.S. Cl.
 CPC ............ *H10F 39/811* (2025.01); *H01L 24/05* (2013.01); *H01L 24/08* (2013.01); *H01L 24/09* (2013.01);
 (Continued)

(58) Field of Classification Search
 CPC .... H10F 39/811; H10F 39/019; H10F 39/809; H10F 39/18; H10F 39/199; H10F 39/8053; H10F 39/018; H10F 39/8063; H10F 39/807; H10F 39/182; H10F 39/8037; H10F 39/12; H10F 39/014; H10F 39/813; H10F 39/803; H10F 39/8023; H10F 39/011; H10F 39/8033; H10F 39/184; H10F 39/191; H10F 39/1825; H10F 19/50; H10F 39/153; H10F 39/016; H10F 39/1847; H10F 39/15; H10F 39/152; H10F 39/157; H10F 39/021;
 (Continued)

(56) References Cited

U.S. PATENT DOCUMENTS 8,987,648 B2  3/2015  Kobayashi
9,082,820 B2  7/2015  Shimotsusa
(Continued)

FOREIGN PATENT DOCUMENTS

CN  103579263 A  *  2/2014  ........... H10F 39/199
KR  1020190131489 A  11/2019

*Primary Examiner* — Niki H Nguyen
(74) *Attorney, Agent, or Firm* — Muir Patent Law, PLLC

(57) ABSTRACT

An image sensor includes a stack structure including an active pixel region in which a plurality of pixels are defined, and a pad region arranged on at least one side of the active pixel region. The stack structure includes a first substrate including a photoelectric conversion region and a floating diffusion region in each pixel, a first semiconductor substrate, a first front structure on the first semiconductor substrate, and a pad opening penetrating the first semiconductor substrate in the pad region, a second substrate attached to the first substrate and including a pixel gate electrically connected to the floating diffusion region in each pixel, a third substrate attached to the second substrate and including a logic transistor for driving the plurality of pixels, and a pad having a top surface that is exposed through the pad opening.

20 Claims, 25 Drawing Sheets

(51) Int. Cl.
*H10F 39/00* (2025.01)
*H10F 39/18* (2025.01)

(52) U.S. Cl.
CPC ......... *H10F 39/018* (2025.01); *H10F 39/809* (2025.01); *H01L 24/80* (2013.01); *H01L 2224/05166* (2013.01); *H01L 2224/05181* (2013.01); *H01L 2224/05186* (2013.01); *H01L 2224/05567* (2013.01); *H01L 2224/05571* (2013.01); *H01L 2224/05624* (2013.01); *H01L 2224/05644* (2013.01); *H01L 2224/05647* (2013.01); *H01L 2224/05655* (2013.01); *H01L 2224/08145* (2013.01); *H01L 2224/0903* (2013.01); *H01L 2224/09181* (2013.01); *H01L 2224/8082* (2013.01); *H01L 2924/04941* (2013.01); *H01L 2924/04953* (2013.01); *H10F 39/18* (2025.01)

(58) Field of Classification Search
CPC ...... H10F 39/196; H10F 77/40; H10F 39/028; H10F 39/8057; H10F 39/802; H01L 24/05; H01L 24/08; H01L 24/09; H01L 2224/05166; H01L 2224/05181; H01L 2224/05186; H01L 2224/05567; H01L 2224/05571; H01L 2224/05647; H01L 2224/05655; H01L 2224/08145; H01L 2224/0903; H01L 2224/09181; H01L 2224/8082; H01L 2924/04941; H01L 2924/04953

See application file for complete search history.

(56) References Cited

U.S. PATENT DOCUMENTS

| | | |
|---|---|---|
| 9,431,450 B2 | 8/2016 | Umebayashi et al. |
| 10,026,769 B2 | 7/2018 | Kagawa et al. |
| 10,297,631 B2 | 5/2019 | Ho et al. |
| 10,475,827 B2 | 11/2019 | Roy |
| 10,854,657 B2 | 12/2020 | Inoue et al. |
| 10,998,369 B2 | 5/2021 | Hashiguchi et al. |
| 2017/0345854 A1* | 11/2017 | Kwon ................... H10F 39/802 |
| 2021/0084249 A1 | 3/2021 | Nakazawa et al. |
| 2021/0104571 A1 | 4/2021 | Shohji et al. |

* cited by examiner

IMAGE SENSOR

CROSS-REFERENCE TO RELATED APPLICATION

This application is based on and claims priority under 35 U.S.C. § 119 to Korean Patent Application No. 10-2021-0122069, filed on Sep. 13, 2021, in the Korean Intellectual Property Office, the disclosure of which is incorporated by reference herein in its entirety.

BACKGROUND

The inventive concept relates to an image sensor, and more particularly, to an image sensor including photodiodes.

Image sensors convert an optical image signal into an electrical signal. The image sensor includes a plurality of pixels, each of which receives incident light, converts the incident light into an electrical signal and includes a photodiode region, and a pad region that provides the plurality of pixels with an electrical connection with an external device. As the degree of integration of the image sensor increases, the size of each pixel decreases, whereas the size of the pad region relatively increases, and thus, the pad region may cause a defect in a process of forming components of pixels.

SUMMARY

The inventive concept provides an image sensor capable of preventing a defect in a pixel forming process.

According to an aspect of the inventive concept, there is provided an image sensor including a stack structure including an active pixel region in which a plurality of pixels are defined, and a pad region arranged on at least one side of the active pixel region. Each of the plurality of pixels includes a photoelectric conversion region and a floating diffusion region. The stack structure includes: a first substrate including a first semiconductor substrate at which a photoelectric conversion region and a floating diffusion region in each of the plurality of pixels are disposed, a first front structure arranged on the first semiconductor substrate, and a pad opening penetrating the first semiconductor substrate in the pad region; a second substrate attached to the first substrate and including a plurality of pixel gates each of which is electrically connected to the floating diffusion region in a corresponding pixel of the plurality of pixels; a third substrate attached to the second substrate and including a logic transistor for driving the plurality of pixels; and a pad having a top surface that is exposed through the pad opening.

According to an aspect of the inventive concept, there is provided an image sensor including a stack structure including an active pixel region in which a plurality of pixels are defined, and a pad region arranged on at least one side of the active pixel region. Each of the plurality of pixels includes a photoelectric conversion region and a floating diffusion region. The stack structure includes: a first substrate including a first semiconductor substrate including a first surface and a second surface, a photoelectric conversion region and a floating diffusion region in each pixel of the plurality of pixels being disposed at the first semiconductor substrate, a first front structure, which is arranged on the first surface of the first semiconductor substrate, and a pad opening penetrating the first semiconductor substrate in the pad region; a second substrate attached to the first front structure of the first substrate and including a plurality of pixel gates each of which is electrically connected to a floating diffusion region in a corresponding pixel of the plurality of pixels; a third substrate attached to the second substrate and including a logic transistor for driving the plurality of pixels; and a pad having a top surface exposed through the pad opening in the pad region. The top surface of the pad is arranged at a level lower than the first surface of the first semi conductor substrate.

According to an aspect of the inventive concept, there is provided an image sensor including a stack structure including an active pixel region in which a plurality of pixels are defined, and a pad region arranged on at least one side of the active pixel region. The stack structure includes: a first substrate, a second substrate, and a third substrate, which are stacked in a vertical direction; and a pad arranged in the pad region. The first substrate includes a first semiconductor substrate and a first front structure arranged on the first semiconductor substrate. The first semiconductor substrate includes a photoelectric conversion region and a floating diffusion region, which are in each of the plurality of pixels. The second substrate includes a second semiconductor substrate and a second front structure arranged on the second semiconductor substrate. The second front structure is in contact with the first front structure. The second substrate includes a plurality of pixel gates each of which is electrically connected to a floating diffusion region in a corresponding pixel of the plurality of pixels. The third substrate includes a third semiconductor substrate and a third front structure arranged on the third semiconductor substrate. The third substrate includes a logic transistor for driving the plurality of pixels. The pad has a top surface that is exposed through a pad opening penetrating the first substrate and a sidewall that is surrounded by the first front structure.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the accompanying drawings.

Figure 1:
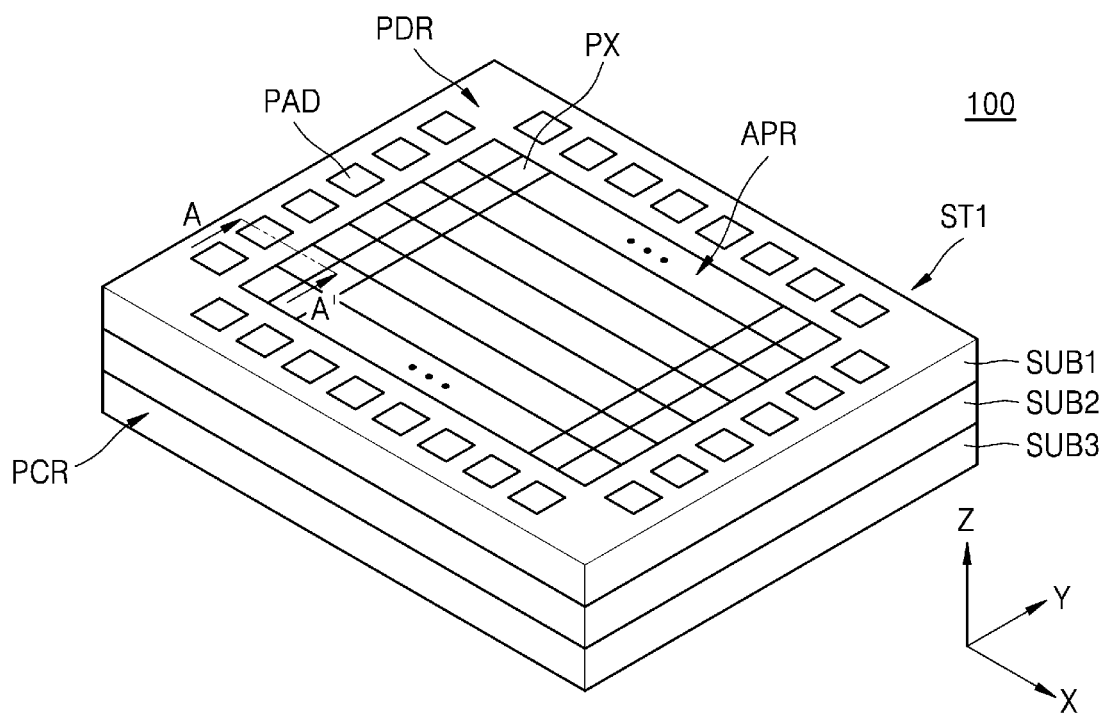
FIG. 1 is a perspective view illustrating an image sensor, according to example embodiments.
Figure 2:
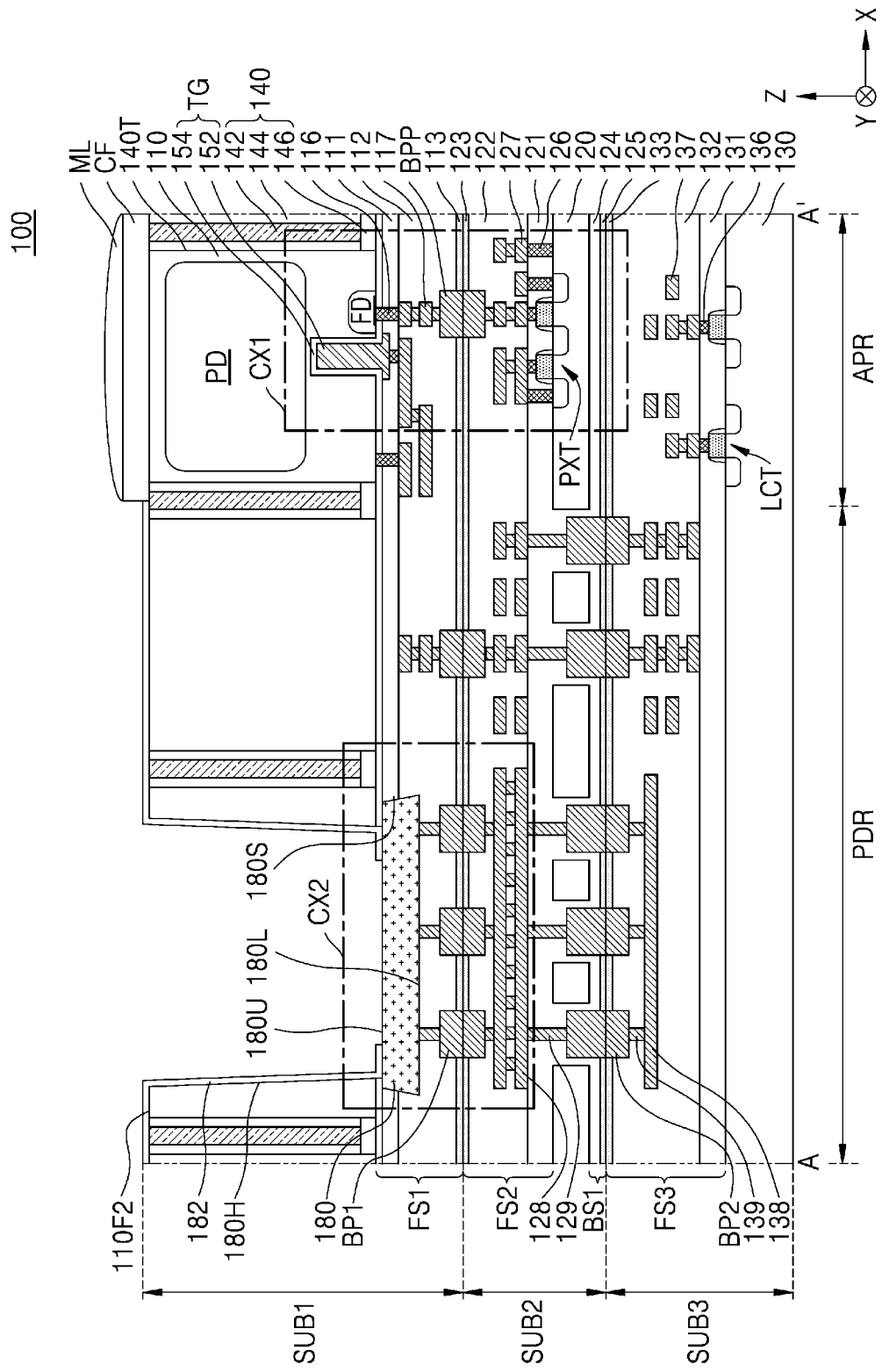
FIG. 2 is a cross-sectional view taken along line A-A' of FIG. 1.
Figure 3:
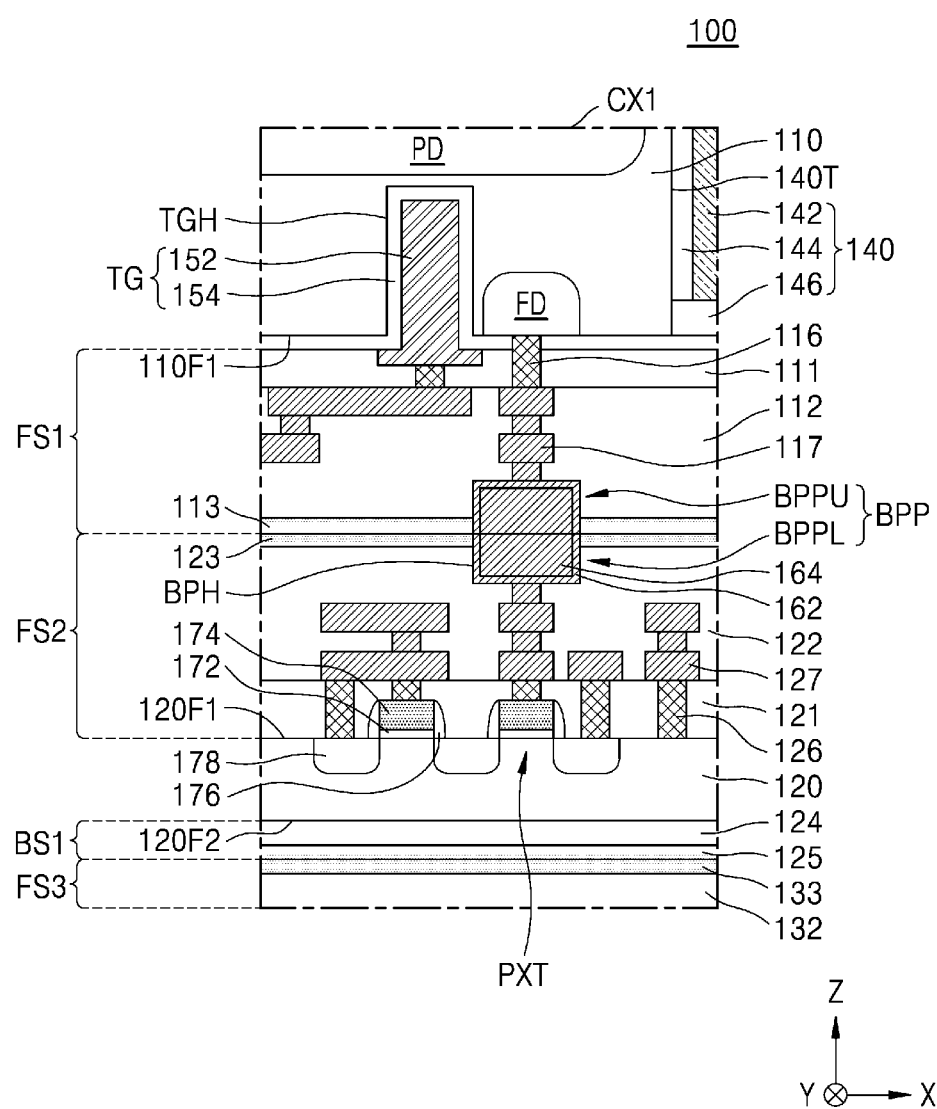
FIG. 3 is an enlarged view of region CX1 of FIG. 2.
Figure 4:
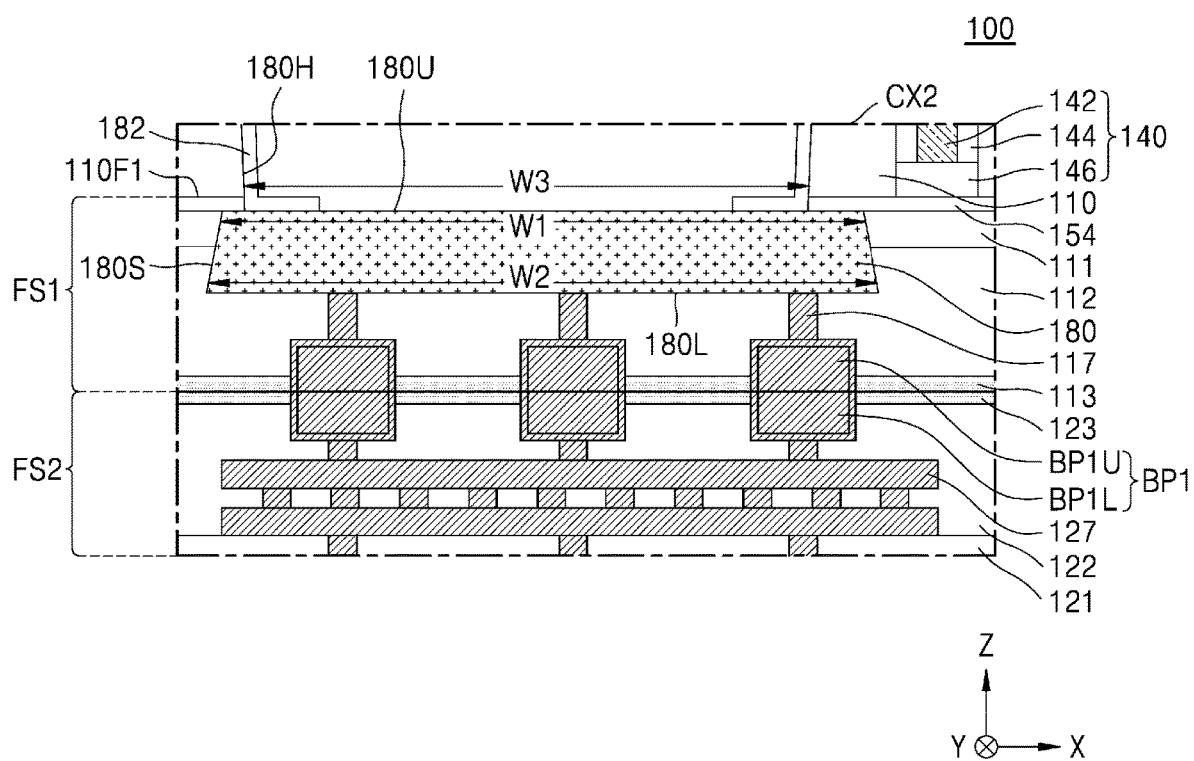
FIG. 4 is an enlarged view of region CX2 of FIG. 2.
Figure 5:
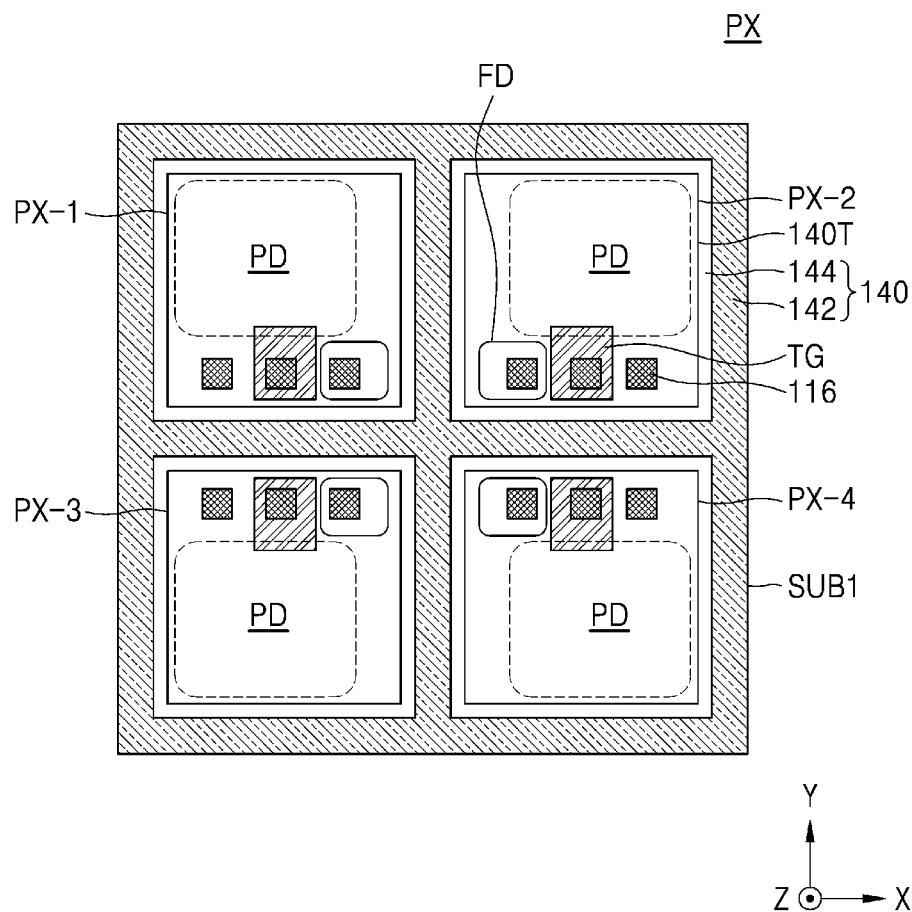
FIG. 5 is a layout diagram illustrating a first substrate corresponding to a single pixel of FIG. 2.
Figure 6:
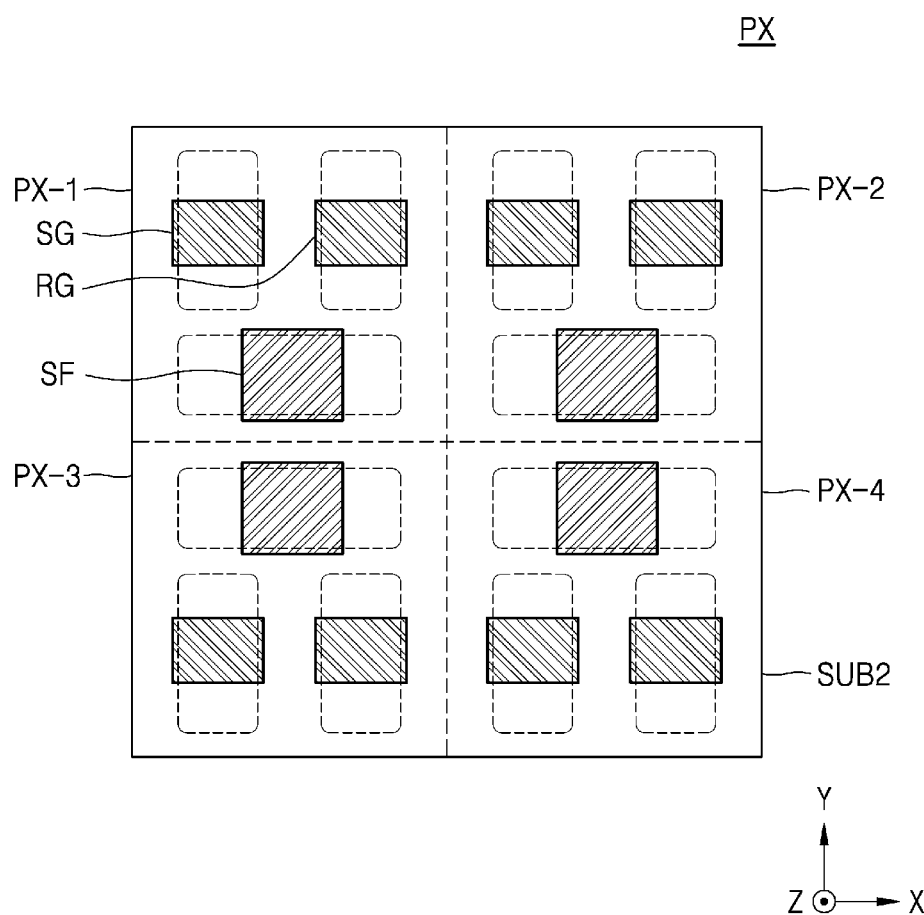
FIG. 6 is a layout diagram illustrating a first substrate corresponding to a single pixel of FIG. 2.

FIG. 1 is a perspective view illustrating an image sensor 100, according to example embodiments. FIG. 2 is a cross-sectional view taken along line A-A' of FIG. 1. FIG. 3 is an enlarged view of region CX1 of FIG. 2. FIG. 4 is an enlarged view of region CX2 of FIG. 2. FIG. 5 is a layout diagram illustrating a first substrate SUB1 corresponding to a single pixel PX of FIG. 2. FIG. 6 is a layout diagram illustrating a second substrate SUB2 corresponding to the single pixel PX of FIG. 2.

Referring to FIGS. 1 to 6, the image sensor 100 may be a stacked image sensor including a stack structure ST1 in which the first substrate SUB1, the second substrate SUB2, and a third substrate SUB3 are stacked on each other in a vertical direction (e.g., a third direction Z). Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

An active pixel region APR may be arranged at a central portion of the stack structure ST1. A plurality of pixels PX may be arranged in the active pixel region APR. The plurality of pixels PX may be regions that receive light from the outside of the stack structure ST1 and convert the light into electrical signals. The plurality of pixels PX may be arranged in the first substrate SUB1 and the second substrate SUB2. For example, a photoelectric conversion region PD for receiving external light may be arranged in the first substrate SUB1, and transistors constituting a pixel circuit (not shown) for converting photocharges accumulated in the photoelectric conversion region PD into electrical signals may be arranged in the second substrate SUB2.

A pad region PDR may be arranged on at least one side surface of the active pixel region APR, for example, on four side surfaces of the active pixel region APR, when viewed in a plan view. A plurality of pads PAD may be arranged in the pad region PDR, and may be configured to transmit and receive an electrical signal to and from an external device or the like.

A peripheral circuit region PCR may include a logic circuit block and/or a memory device. For example, the logic circuit block may include a plurality of logic transistors LCT, and may provide each pixel PX of the active pixel region APR with an input signal or may control an output signal of each pixel PX. For example, the logic transistor LCT may include at least one of a row decoder, a row driver, a column decoder, a timing generator, a correlated double sampler (CDS), an analog-to-digital converter, and an input/output (I/O) buffer.

The active pixel region APR may include the plurality of pixels PX, and a plurality of photoelectric conversion regions PD may be arranged in each of the plurality of pixels PX. In the active pixel region APR, the plurality of pixels PX may be arranged in a matrix form in rows and columns in a first direction X parallel to the top surface of a first semiconductor substrate 110 and a second direction Y perpendicular to the first direction and parallel to the top surface of the first semiconductor substrate 110. Some of the plurality of pixels PX may be optical black pixels (not shown). The optical black pixel may function as a reference pixel for the active pixel region APR, and may perform a function of automatically correcting a dark signal.

The first substrate SUB1 may include the first semiconductor substrate 110, a first front structure FS1 arranged on a first surface 110F1 of the first semiconductor substrate 110, and a color filter CF and a microlens ML. The color filter CF and the microlens ML may be arranged on a second surface 110F2, opposite to the first surface 110F1, of the first semiconductor substrate 110. The second substrate SUB2 may include a second semiconductor substrate 120, a second front structure FS2 arranged on a first surface 120F1 of the second semiconductor substrate 120, and a rear structure BS1 arranged on a second surface 120F2 of the second semiconductor substrate 120. The third substrate SUB3 may include a third semiconductor substrate 130 and a third front structure FS3 arranged on the top surface of the third semiconductor substrate 130.

The second substrate SUB2 may be arranged between the first substrate SUB1 and the third substrate SUB3. For example, the second front structure FS2 in the second substrate SUB2 and the first front structure FS1 in the first substrate SUB1 may face each other and may be in contact with each other. The rear structure BS1 in the second substrate SUB2 and the third front structure FS3 in the third substrate SUB3 may face each other and may be in contact with each other.

In example embodiments, the first to third semiconductor substrates 110, 120, and 130 may include or may be a P-type semiconductor substrate. For example, at least one of the first to third semiconductor substrates 110, 120, and 130 may be a P-type silicon substrate. In example embodiments, at least one of the first to third semiconductor substrates 110, 120, and 130 may include a P-type bulk substrate and a P-type or N-type epitaxial layer grown thereon. In example embodiments, at least one of the first to third semiconductor substrates 110, 120, and 130 may include an N-type bulk substrate and a P-type or N-type epitaxial layer grown thereon.

The first front structure FS1 may include a first insulating layer 111, a second insulating layer 112, and a third insulating layer 113, which are sequentially arranged on the first surface 110F1 of the first semiconductor substrate 110. The first front structure FS1 may include a conductive via 116 penetrating the first insulating layer 111, and a wiring layer 117 arranged in the second insulating layer 112. For example, the first and second insulating layers 111 and 112 may include or may be formed of silicon oxide, and the third insulating layer 113 may include or may be formed of silicon oxide, silicon nitride, silicon oxynitride, or silicon carbon nitride. Each of the first and second insulating layers 111 and 112 may be formed in a stack structure including a plurality of insulating layers (not shown), and additional insulating liners (not shown) may be further arranged between the plurality of insulating layers.

The second front structure FS2 may include a first insulating layer 121, a second insulating layer 122, and a third insulating layer 123, which are sequentially arranged on the first surface 120F1 of the second semiconductor substrate 120. The second front structure FS2 may include a conductive via 126 penetrating the first insulating layer 121, and a wiring layer 127 arranged in the second insulating layer 122.

The rear structure BS1 may include a fourth insulating layer 124 and a fifth insulating layer 125, which are sequentially arranged on the second surface 120F2 of the second semiconductor substrate 120. For example, the first insulating layer 121, the second insulating layer 122, and the fourth insulating layer 124 may include or may be formed of silicon oxide, and the third insulating layer 123 and the fifth insulating layer 125 may include or may be formed of silicon oxide, silicon nitride, silicon oxynitride, or silicon carbon nitride.

The third front structure FS3 may include a first insulating layer 131, a second insulating layer 132, and a third insulating layer 133, which are sequentially arranged on the top surface of the third semiconductor substrate 130. The third front structure FS3 may include a conductive via 136 penetrating the first insulating layer 131, and a wiring layer 137 arranged in the second insulating layer 132. For example, the first and second insulating layers 131 and 132 may include or may be formed of silicon oxide, and the third insulating layer 133 may include or may be formed of silicon oxide, silicon nitride, silicon oxynitride, or silicon carbon nitride.

In example embodiments, the conductive vias 116, 126, and 136 and the wiring layers 117, 127, and 137 may include or may be formed of at least one of copper (Cu), aluminum (Al), tungsten (W), titanium (Ti), titanium nitride (TiN), tantalum (Ta), tantalum nitride (TaN), ruthenium (Ru), and tungsten nitride (WN).

The first substrate SUB1 and the second substrate SUB2 may be arranged such that the first front structure FS1 and the second front structure FS2 face each other, and for example, such that the third insulating layer 113 of the first front structure FS1 is in contact with the third insulating layer 123 of the second front structure FS2.

In the pad region PDR, first bonding pads BP1 may be arranged at the interface between the first substrate SUB1 and the second substrate SUB2. The first bonding pad BP1 may include an upper pad portion BP1U and a lower pad portion BP1L, and the upper pad portion BP1U and the lower pad portion BP1L may be arranged to vertically overlap each other and may be bonded with each other. For example, the interface between the upper pad portion BP1U and the lower pad portion BP1L, for example, the bonding interface therebetween, may be coplanar with the interface between the third insulating layer 113 of the first front structure FS1 and the third insulating layer 123 of the second front structure FS2. For example, the first substrate SUB1 and the second substrate SUB2 may be stacked or may be bonded with each other in a metal-oxide hybrid bonding manner.

In the pad region PDR, second bonding pads BP2 may be arranged at the interface between the second substrate SUB2 and the third substrate SUB3. The second bonding pad BP2 may include an upper pad portion BP2U (see FIG. 9) and a lower pad portion BP2L (see FIG. 9), and the upper pad portion BP2U and the lower pad portion BP2L may be arranged to vertically overlap each other and may be bonded with each other. For example, the interface between the upper pad portion BP2U and the lower pad portion BP2L, for example, the bonding interface therebetween, may be coplanar with the interface between the fifth insulating layer 125 of the rear structure BS1 and the third insulating layer 133 of the third front structure FS3. Accordingly, the second substrate SUB2 and the third substrate SUB3 may be stacked or may be bonded with each other by using a metal-oxide hybrid bonding method.

In the active pixel region APR, pixel isolation structures 140 may be arranged in the first substrate SUB1. The plurality of pixels PX may be defined by the pixel isolation structures 140. The pixel isolation structure 140 may include a conductive layer 142, an insulating liner 144, and an upper insulating layer 146. The conductive layer 142 may be arranged in a pixel trench 140T penetrating the first semiconductor substrate 110. The insulating liner 144 may be arranged on an inner wall of the pixel trench 140T penetrating the first semiconductor substrate 110, may extend from the first surface 110F1 to the second surface 110F2 of the first semiconductor substrate 110, and may be arranged between the conductive layer 142 and the first semiconductor substrate 110. The upper insulating layer 146 may be arranged in a portion of the pixel trench 140T adjacent to the first surface 110F1 of the first semiconductor substrate 110.

In example embodiments, the conductive layer 142 may include or may be formed of at least one of doped polysilicon, metal, a metal silicide, a metal nitride, and a metal-containing layer. The insulating liner 144 may include or may be formed of a metal oxide such as hafnium oxide, aluminum oxide, and tantalum oxide. In some embodiments, the insulating liner 144 may act as a negative fixed charge layer. In some embodiments, the insulating liner 144 may include or may be formed of an insulating material such as silicon oxide, silicon nitride, and silicon oxynitride. The upper insulating layer 146 may include or may be formed of an insulating material such as silicon oxide, silicon nitride, and silicon oxynitride.

In the first substrate SUB1, the plurality of photoelectric conversion regions PD may be arranged in the plurality of pixels PX, respectively. The photoelectric conversion region PD may be a region doped with n-type impurities. For example, the photoelectric conversion region PD may have a potential slope in a vertical direction (e.g., z third direction Z) due to a difference in impurity concentration between an upper portion and a lower portion. In some embodiments, the photoelectric conversion region PD may be formed by stacking a plurality of impurity regions in a vertical direction.

In the active pixel region APR, a transfer gate TG and a floating diffusion region FD may be arranged in the first substrate SUB1. For example, a transfer gate trench TGH may be arranged to extend from the first surface 110F1 of the first semiconductor substrate 110 to the inside of the first semiconductor substrate 110, and the transfer gate TG may be arranged in the transfer gate trench TGH. The transfer gate TG may include a transfer gate electrode 152 arranged in the transfer gate trench TGH and a transfer gate insulating layer 154 arranged on an inner wall of the transfer gate trench TGH. The transfer gate insulating layer 154 may be arranged between the first semiconductor substrate 110 and the transfer gate electrode 152. In the first semiconductor substrate 110, the floating diffusion region FD may be arranged at one side of the transfer gate TG to be adjacent to the first surface 110F1 of the first semiconductor substrate 110. The transfer gate TG may constitute a transfer transistor TX (see FIG. 7), and the transfer transistor TX may be configured to transfer charges generated in the photoelectric conversion region PD to the floating diffusion region FD.

In the active pixel region APR, a pixel gate PXT constituting a pixel circuit (not shown) may be arranged in the second substrate SUB2. For example, the pixel gate PXT may be arranged on the first surface 120F1 of the second semiconductor substrate 120. The pixel gate PXT may include a gate insulating layer 172, a gate electrode 174, and a spacer 176. Impurity regions 178 may be arranged in the second semiconductor substrate 120 to be adjacent to the pixel gate PXT. The gate electrode 174 may include or may be formed of at least one of doped polysilicon, metal, a metal silicide, a metal nitride, and a metal-containing layer.

In example embodiments, the pixel gate PXT may include a source follower gate SF, a selection gate SG, and a reset gate RG. For example, the photoelectric conversion region PD and/or the floating diffusion region FD arranged in the first substrate SUB1 in one pixel PX may be electrically connected to the pixel gate PXT arranged in the second substrate SUB2 in the one pixel PX. For example, the photoelectric conversion region PD and/or the floating diffusion region FD arranged in the first substrate SUB1 in one pixel PX may be electrically connected to the source follower gate SF, the selection gate SG, and the reset gate RG arranged in the second substrate SUB2 in the one pixel PX. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. As used herein, components described as being "electrically connected" are configured such that an electrical signal can be transferred from one component to the other (although such electrical signal may be attenuated in strength as it transferred and may be selectively transferred).

In example embodiments, the reset gate RG may constitute a reset transistor RX (see FIG. 7), and the reset transistor RX may be configured to periodically reset charges stored in the floating diffusion region FD. The source follower gate SF may constitute a drive transistor DX (refer to FIG. 7), and the drive transistor DX may serve as a source follower buffer amplifier and may be configured to buffer a signal according to charges accumulated in the floating diffusion region FD. The selection gate SG may constitute a selection transistor SX (refer to FIG. 7), and the selection transistor SX may perform switching and addressing for selecting the pixel PX.

The photoelectric conversion region PD and/or the floating diffusion region FD arranged in the first substrate SUB1 in one pixel PX may be connected to the pixel gate PXT arranged in the second substrate SUB2 in the one pixel PX through a pixel bonding pad BPP. For example, the pixel bonding pad BPP may include an upper pad portion BPPU and a lower pad portion BPPL, and the upper pad portion BPPU and the lower pad portion BPPL may be arranged to vertically overlap each other and may be bonded with each other. For example, the upper pad portion BPPU may be surrounded by the first front structure FS1, and the lower pad portion BPPL may be surrounded by the second front structure FS2. For example, the interface between the upper pad portion BPPU and the lower pad portion BPPL, for example, the bonding interface therebetween, may be coplanar with the interface between the third insulating layer 113 of the first front structure FS1 and the third insulating layer 123 of the second front structure FS2. In some embodiments, the floating diffusion region FD may be connected to the source follower gate SF of the drive transistor DX, which corresponds to the pixel gate PXT. In some embodiments, the floating diffusion region FD may be connected to the pixel gate PXT, which is the source follower gate SF of the drive transistor DX using a connection path extending in a straight line extending in a vertical direction (e.g., a third direction Z). The connection path may include the pixel bonding pad BPP. In some embodiments, the floating diffusion region FD, the bonding pad BPP, and the source follower gate SF of the drive transistor DX may overlap each other in the vertical direction.

Each of the pixel bonding pad BPP, the first bonding pad BP1, and the second bonding pad BP2 may include a barrier layer 162 and a metal layer 164. For example, a bonding pad opening BPH may be formed in the first front structure FS1 and the second front structure FS2, the barrier layer 162 may be arranged on an inner wall of the bonding pad opening BPH, and the metal layer 164 may be arranged on the barrier layer 162 to fill the bonding pad opening BPH. For example, the barrier layer 162 may include or may be formed of at least one of titanium (Ti), tantalum (Ta), titanium nitride (TiN), and tantalum nitride (TaN), and the metal layer 164 may include or may be formed of copper (Cu), gold (Au), nickel (Ni), aluminum (Al), tungsten (W), or a combination thereof. For example, portions of the metal layer 164 respectively in the upper pad portion BPPU and the lower pad portion BPPL may be bonded with each other by interdiffusion of metal atoms through a high-temperature annealing.

In some example embodiments, as illustrated in FIGS. 5 and 6, a first pixel PX-1, a second pixel PX-2, a third pixel PX-3, and a fourth pixel PX-4 may be arranged in a matrix form. Each of the first to fourth pixels PX-1, PX-2, PX-3, and PX-4 in the first substrate SUB1 may have the transfer gate TG and the floating diffusion region FD. The first pixel PX-1 and the third pixel PX-3 arranged consecutively in the second direction Y may have a mirror-symmetrical shape with respect to each other, and the first pixel PX-1 and the second pixel PX-2 arranged consecutively in the first direction X may have a mirror-symmetrical shape with respect to each other. Each of the first to fourth pixels PX-1, PX-2, PX-3, and PX-4 in the second substrate SUB2 may include the reset gate RG, the source follower gate SF, and the selection gate SG. The layouts of the pixels PX illustrated in FIGS. 5 and 6 are only examples, and for example, the size, shape, position, and the like of the transfer gate TG in the first substrate SUB1 and the sizes, shapes, positions, and the like of the reset gate RG, the source follower gate SF, and the selection gate SG in the second substrate SUB2 are not limited to those illustrated in FIGS. 5 and 6.

In the pad region PDR, a pad opening 180H may be arranged to penetrate the first semiconductor substrate 110, and a pad 180 may be arranged below a bottom portion of the pad opening 180H. A top surface 180U of the pad 180 may be exposed by the bottom portion of the pad opening 180H, and an edge of the top surface 180U of the pad 180 may be covered by the first semiconductor substrate 110. Sidewalls 180S and a bottom surface 180L of the pad 180 may be surrounded by the first front structure FS1. For example, the sidewalls 180S of the pad 180 may be covered by the first insulating layer 111 and the second insulating layer 112, and the bottom surface 180L of the pad 180 may be surrounded by the second insulating layer 112.

The pad 180 may be electrically connected to the first bonding pads BP1 through the wiring layer 117 in the first front structure FS1, may be electrically connected to a pad wiring layer 128, pad vias 129, and the second bonding pads BP2 in the second front structure FS2 through the first bonding pads BP1, and may be electrically connected to pad vias 139 and a pad wiring layer 138 in the third front structure FS3 through the second bonding pads BP2. Accordingly, power and signals may be transmitted from an external device to the logic transistors LCT arranged in the third substrate SUB3.

For example, the top surface 180U of the pad 180 may have a first width W1 in the first direction X parallel to the first surface 110F1 of the first semiconductor substrate 110, and the bottom surface 180L of the pad 180 may have a second width W2, which is greater than the first width W1, in the first direction X. The sidewalls 180S of the pad 180 may be inclined at preset angles such that the width of the pad 180 increases in a direction away from the first surface 110F1 of the first semiconductor substrate 110.

In example embodiments, the bottom portion of the pad opening 180H may have a third width W3, which is less than the first width W1, in the first direction X. Accordingly, an edge of the top surface 180U of the pad 180 may not be exposed by the bottom portion of the pad opening 180H, and may be covered by the first surface 110F1 of the first semiconductor substrate 110.

In example embodiments, the pad 180 may include or may be formed of, but is not limited to, at least one of aluminum (Al), gold (Au), nickel (Ni), copper (Cu), tungsten (W), and titanium nitride (TiN). In some examples, the pad 180 may include a pad layer (not shown) including or being formed of aluminum (Al), and a barrier layer (not shown) surrounding the top surface and/or the bottom surface of the pad layer and including and being formed of titanium nitride (TiN).

Although FIG. 4 illustrates that the top surface 180U of the pad 180 has a width less than a width of the bottom surface 180L of the pad 180, the top surface 180U of the pad 180 and the bottom surface 180L of the pad 180 may have substantially the same width as each other. The sidewalls 180S of the pad 180 may extend substantially perpendicular to the top surface 180U and the bottom surface 180L. Although FIG. 2 illustrates an example in which the width of the top of the pad opening 180H is greater than the width of the bottom of the pad opening 180H, and the sidewalls of the pad opening 180H are inclined at preset angles, the width of the top of the pad opening 180H is substantially the same as the width of the bottom of the pad opening 180H, and the sidewalls of the pad opening 180H may extend substantially perpendicular to the top surface 180U and the bottom surface 180L. Terms such as "same," "equal," "perpendicular," "planar," or "coplanar," as used herein encompass near identicality including variations that may occur, for example, due to manufacturing processes. The term "substantially" may be used herein to emphasize this meaning, unless the context or other statements indicate otherwise.

The color filter CF and the microlens ML may be arranged on the second surface 110F2 of the first semiconductor substrate 110. A passivation layer 182 may be conformally arranged on an inner wall of the pad opening 180H on the second surface 110F2 of the first semiconductor substrate 110. The passivation layer 182 may include or may be formed of an insulating material such as silicon oxide, silicon nitride, silicon oxynitride, and a low-k dielectric material. In some embodiments, the passivation layer 182 may be omitted.

The pad 180 is formed on the second surface 110F2 of the first semiconductor substrate 110 to have a difference in top surface level with the second surface 110F2, and a coating defect of the color filter CF and/or a patterning failure of the microlens ML may occur due to the difference in top surface level of the pad 180 in a process of forming the color filter CF and the microlens ML on the second surface 110F2.

According to the above-described embodiments, the pad 180 may be arranged to be surrounded by the first front structure FS1, and the top surface of the pad 180 may be exposed through the bottom portion of the pad opening 180H penetrating the first semiconductor substrate 110. The pad 180 may be formed in a process of forming the first front structure FS1 on the first semiconductor substrate 110, then the pad opening 180H may be formed after the color filter CF and the microlens ML are formed, and thus, the top surface 180U of the pad 180 may be exposed through the pad opening 180H. Accordingly, a coating defect of the color filter CF and/or a patterning defect of the microlens ML may be prevented.

According to the above-described embodiments, the photoelectric conversion region PD and the transfer gate TG of the pixel PX may be arranged in the first substrate SUB1, and the pixel gate PXT may be arranged in the second substrate SUB2, which is attached to the first substrate SUB1 through the pixel bonding pad BPP. Accordingly, the size of the pixel PX (i.e., a pixel footprint that is a physical area occupied by a pixel)) may reduce, and the resolution of the image sensor 100 may increase.

Figure 7:
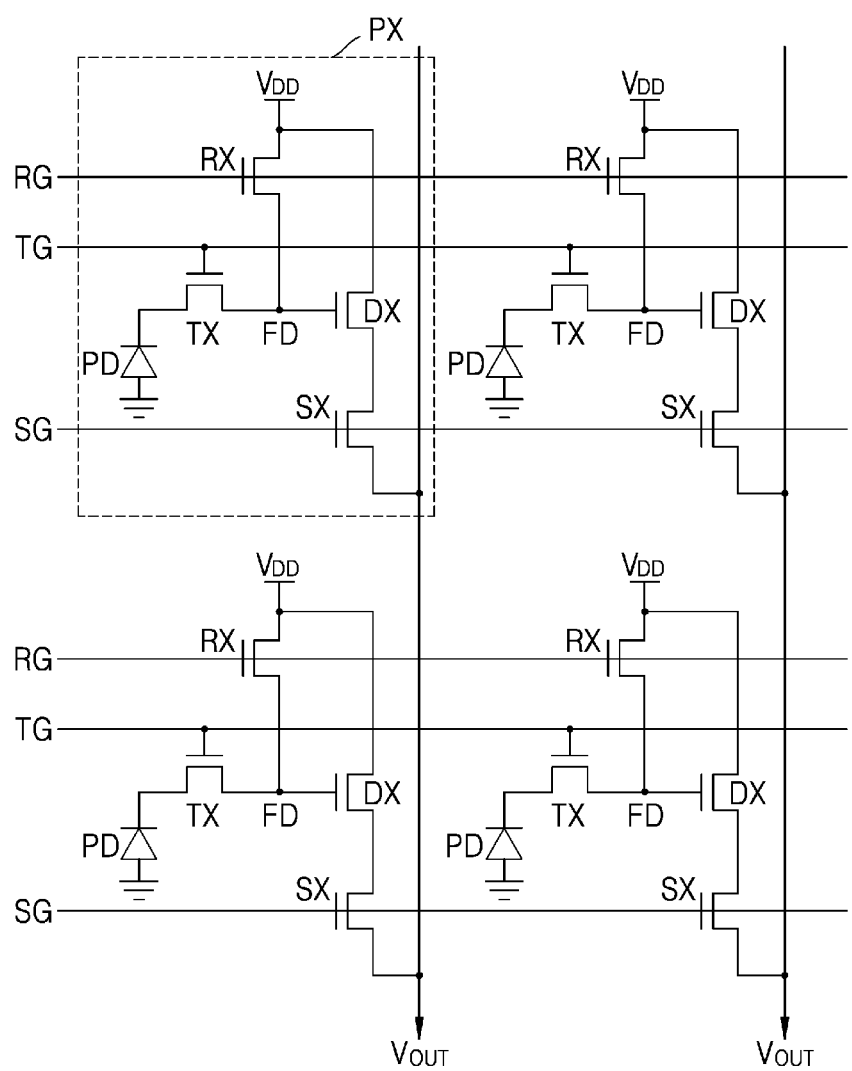
FIG. 7 is an equivalent circuit diagram of pixels of an image sensor, according to example embodiments.

FIG. 7 is an equivalent circuit diagram of the pixels PX of the image sensor 100, according to example embodiments.

Referring to FIG. 7, the plurality of pixels PX may be arranged in a matrix form. Each of the plurality of pixels PX may include the transfer transistor TX and pixel transistors (not shown). In some embodiments, the pixel transistors may include the reset transistors RX, the selection transistors SX, and the drive transistors DX (or source follower transistors). The reset transistor RX may include the reset gate RG, the selection transistor SX may include the selection gate SG, the drive transistor DX may include the source follower gate SF, and the transfer transistor TX may include the transfer gate TG.

Each of the plurality of pixels PX may further include the photoelectric conversion region PD and the floating diffusion region FD. The photoelectric conversion region PD may correspond to the photoelectric conversion region PD as described with reference to FIGS. 1 to 6. The photoelectric conversion region PD may generate and accumulate photo-charges in proportion to an amount of light incident from the outside, and may include a photodiode, a phototransistor, a photogate, a pinned photodiode (PPD), and a combination thereof.

The transfer gate TG may transfer, to the floating diffusion region FD, electric charges generated in the photoelectric conversion region PD. The floating diffusion region FD may receive and cumulatively store the electric charges generated in the photoelectric conversion region PD. The drive transistor DX may be controlled according to the amount of the photo-charges accumulated in the floating diffusion region FD.

The reset transistor RX may periodically reset the electric charges accumulated in the floating diffusion region FD. The drain electrode of the reset transistor RX is connected to the floating diffusion region FD, and the source electrode of the reset transistor RX is connected to a power supply voltage $V_{DD}$. When the reset transistor RX is turned on, the power supply voltage $V_{DD}$ connected to the source electrode of the reset transistor RX is applied to the floating diffusion region FD. When the reset transistor RX is turned on, the electric charges accumulated in the floating diffusion region FD may be discharged, and thus, the floating diffusion region FD may be reset.

The drive transistor DX is connected to a current source (not shown) located outside the plurality of pixels PX, functions as a source follower buffer amplifier, amplifies a potential change in the floating diffusion region FD, and outputs the amplified potential change to an output line $V_{OUT}$.

The selection transistor SX may select a row of pixels among the plurality of pixels PX, and when the selection transistor SX is turned on, the power supply voltage $V_{DD}$ may be applied to the source electrode of the drive transistor DX.

Figure 8:
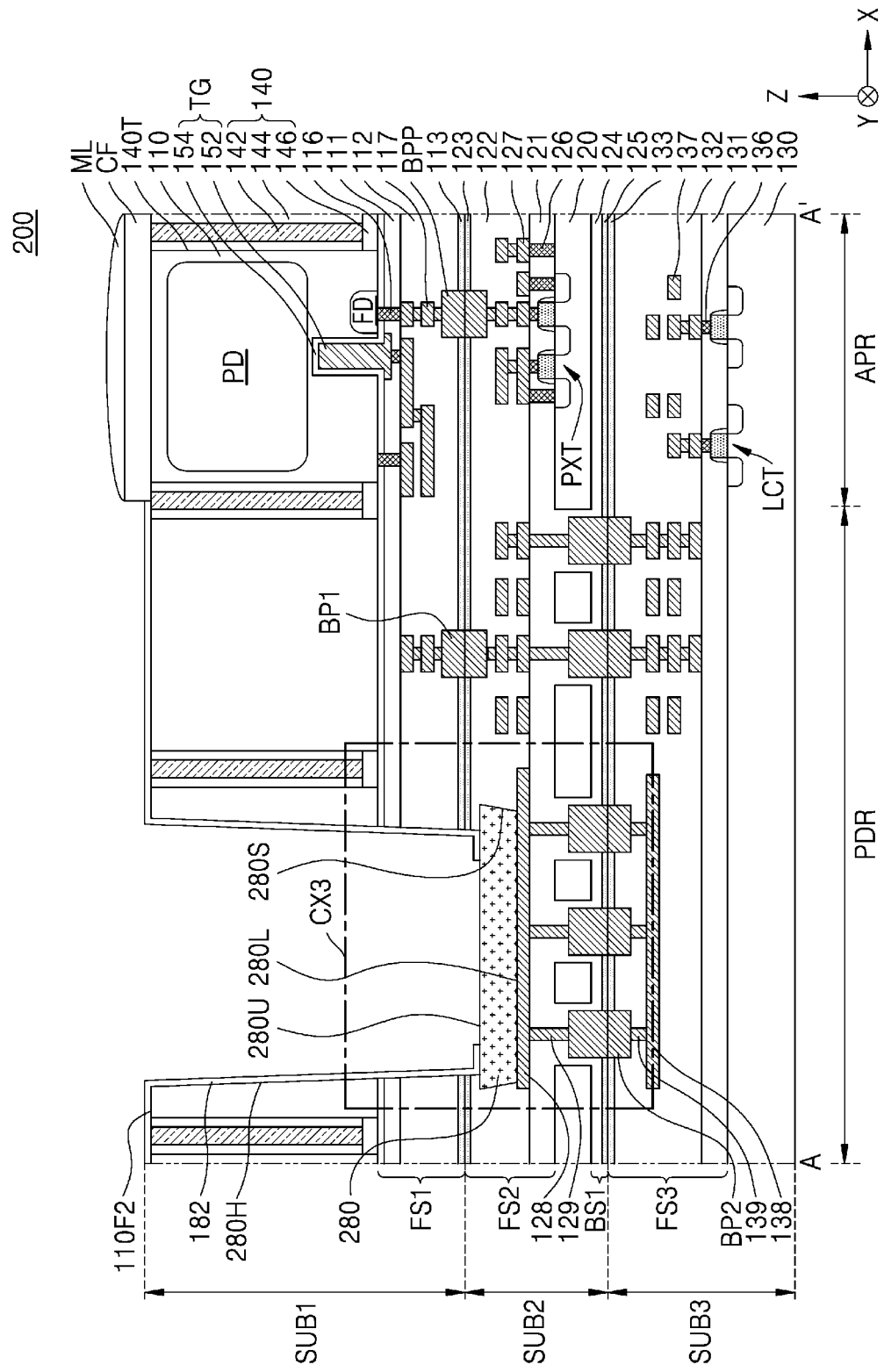
FIG. 8 is a cross-sectional view illustrating an image sensor, according to example embodiments.
Figure 9:
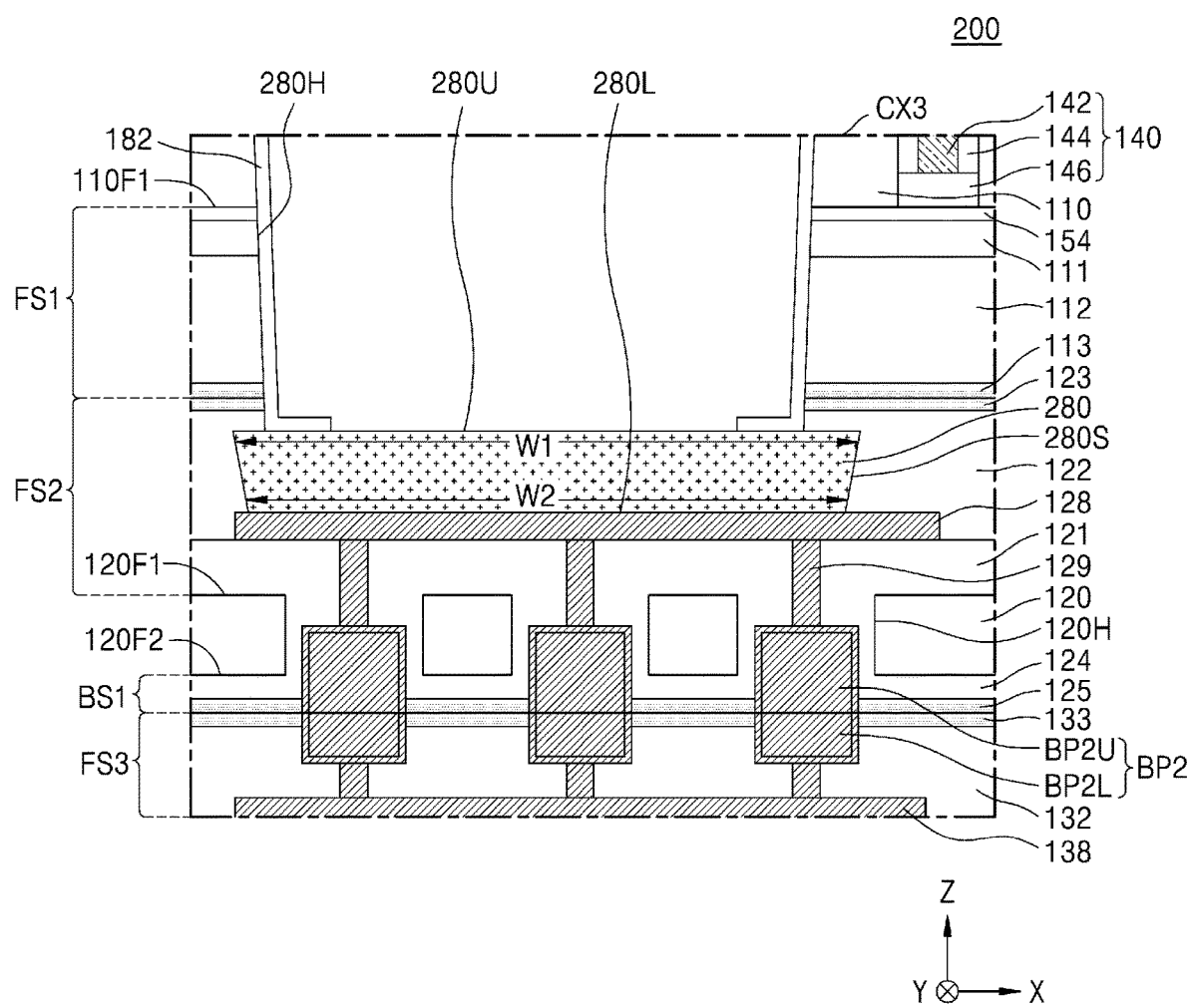
FIG. 9 is an enlarged view of region CX3 of FIG. 8.

FIG. 8 is a cross-sectional view illustrating an image sensor 200, according to example embodiments. FIG. 9 is an enlarged view of region CX3 of FIG. 8. In FIGS. 8 and 9, the same reference numerals as those in FIGS. 1 to 7 denote the same elements.

Referring to FIGS. 8 and 9, a pad opening 280H may penetrate the first semiconductor substrate 110 and the first front structure FS1, and may extend into the second substrate SUB2. A pad 280 may be arranged in the second substrate SUB2, and for example, an edge of a top surface 280U of the pad 280 and side surfaces 280S of the pad 280 may be surrounded by the second front structure FS2. A central portion of the top surface 280U of the pad 280 may be exposed through a bottom portion of the pad opening 280H, and the bottom surface 280L of the pad 280 may be arranged on the pad wiring layer 128. The width of the pad wiring layer 128 may be greater than a width of the bottom surface 280L of the pad 280, and accordingly, the bottom surface 280L of the pad 280 may be entirely arranged on the top surface of the pad wiring layer 128.

The passivation layer 182 may extend along an inner wall of the pad opening 280H, for example, to be formed on the second surface 110F2 of the first semiconductor substrate 110, sidewalls of a portion of the pad opening 280H penetrating the first semiconductor substrate 110, sidewalls of a portion of the pad opening 280H penetrating the first front structure FS1, and sidewalls of a portion of the pad opening 280H formed in the second front structure FS2, and may cover the edge of the top surface 280U of the pad 280.

As illustrated in FIG. 9, the top surface 280U of the pad 280 may have the first width W1 in the first direction X, and the bottom surface 280L of the pad 280 may have the second width W2 in the first direction X, which is less than the first width W1. However, the inventive concept is not limited thereto.

In example embodiments, the bottom surface 280L of the pad 280 may be electrically connected to the pad vias 129 through the pad wiring layer 128, and may be electrically connected to the second bonding pads BP2 through the pad vias 129. The second bonding pad BP2 may include the upper pad portion BP2U and the lower pad portion BP2L, and the upper pad portion BP2U and the lower pad portion BP2L may be arranged to vertically overlap each other and may be bonded with each other. As illustrated in FIG. 9, a plurality of through holes 120H (hereinafter, also referred to as the plurality of second through holes 120H) may be arranged to penetrate the second semiconductor substrate 120, and at least a portion of the upper pad portion BP2U and at least a portion of the pad via 129 may be arranged in the plurality of through holes 120H.

In some embodiments, unlike that illustrated in FIG. 9, only the upper pad portion BP2U may be arranged in the plurality of through holes 120H, and a bottom surface of the pad vias 129 may be arranged at a higher vertical level than a first surface 120F1 (i.e., a top surface) of the second semiconductor substrate 120. In some embodiments, unlike that illustrated in FIG. 9, only the pad vias 129 may be arranged in the plurality of through holes 120H, and the upper pad portion BP2U may be arranged at a lower vertical level than the second surface 120F2 (i.e., a bottom surface) of the second semiconductor substrate 120, for example, to be surrounded by the rear structure BS1.

Figure 10:
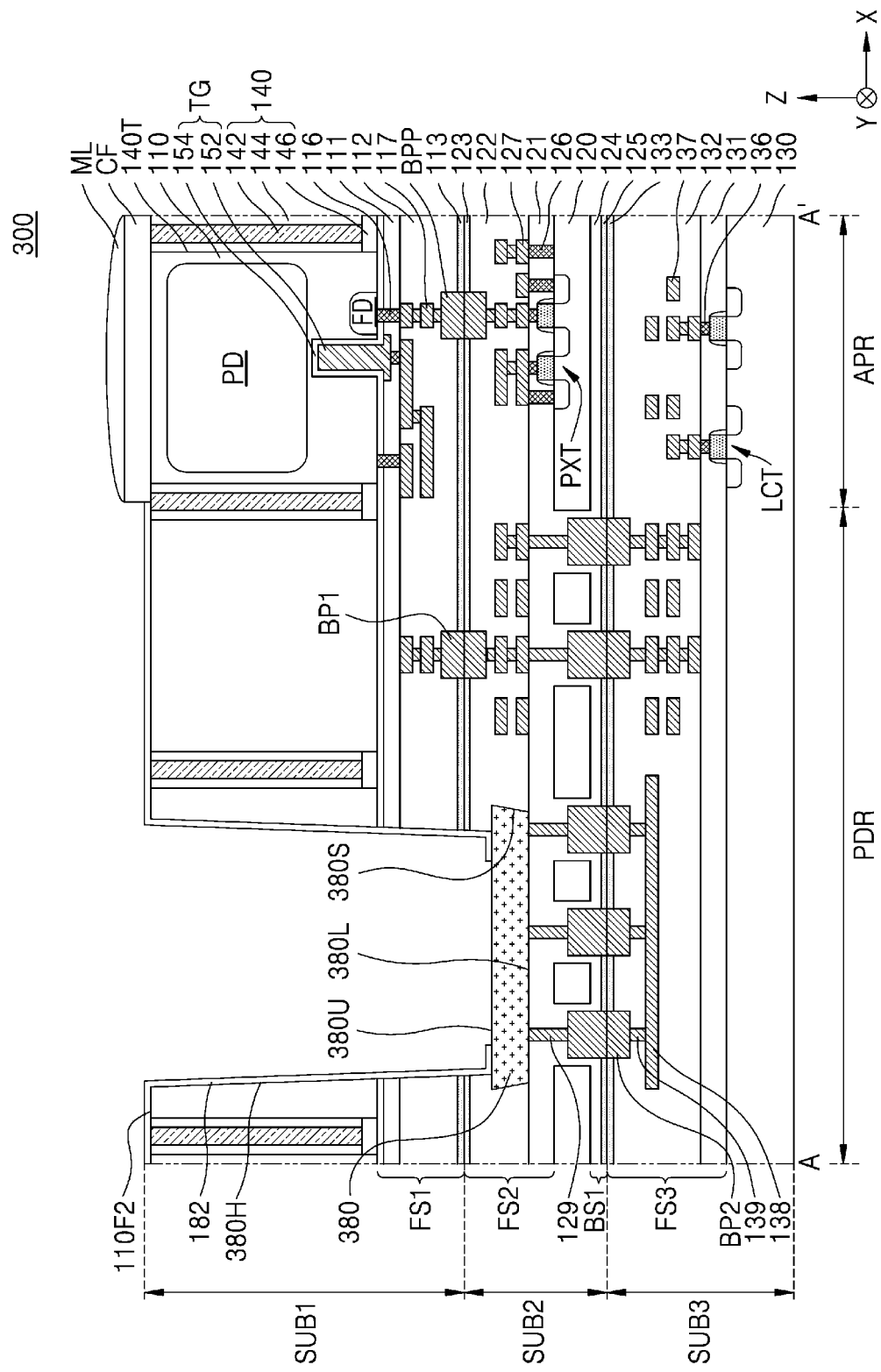
FIG. 10 is a cross-sectional view illustrating an image sensor, according to example embodiments.

FIG. 10 is a cross-sectional view illustrating an image sensor 300, according to example embodiments. In FIG. 10, the same reference numerals as those in FIGS. 1 to 9 denote the same elements.

Referring to FIG. 10, a pad opening 380H may penetrate the first semiconductor substrate 110 and the first front structure FS1, and may extend into the second substrate SUB2. A pad 380 may be arranged in the second substrate SUB2, and for example, side surfaces 380S of the pad 380 may be surrounded by the second front structure FS2, and a top surface 380U of the pad 380 may be exposed through a bottom portion of the pad opening 380H. The pad wiring layer 128 (see FIG. 9) may be omitted, and a bottom surface 380L of the pad 380 may be arranged directly on the pad vias 129 and the first insulating layer 121. In some embodiments, the bottom surface 380L of the pad 380 may contact the pad vias 129 and the first insulating layer 121.

Figure 11:
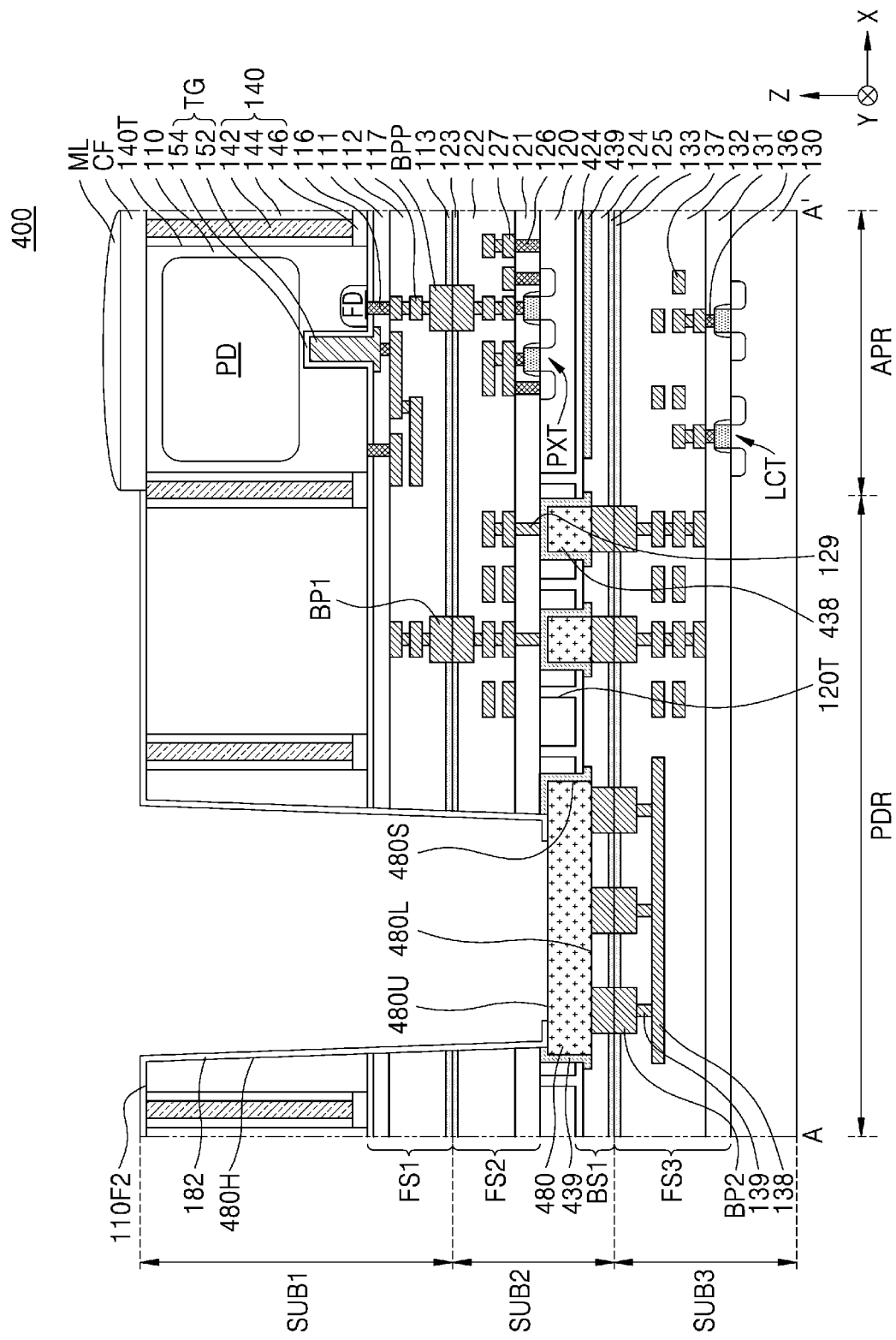
FIG. 11 is a cross-sectional view illustrating an image sensor, according to example embodiments.

FIG. 11 is a cross-sectional view illustrating an image sensor 400, according to example embodiments. In FIG. 11, the same reference numerals as those in FIGS. 1 to 10 denote the same elements.

Referring to FIG. 11, a pad opening 480H may penetrate the first semiconductor substrate 110, the first front structure FS1, and the second front structure FS2, and may extend into the second semiconductor substrate 120.

A pad 480 may be arranged in the second substrate SUB2, and for example, may be arranged in at least one of a plurality of through trenches 120T (hereinafter, also referred to as the first to third through trenches), which penetrate the second semiconductor substrate 120. The pad 480 may be arranged in the first through trench among the plurality of through trenches 120T, and a reflective metal layer 439 may be further arranged between the first through trench and the pad 480. For example, side surfaces 480S of the pad 480 may be surrounded by the reflective metal layer 439 in the first through trench, and a top surface 480U of the pad 480 may be exposed through a bottom portion of the pad opening 480H. A bottom surface 480L of the pad 480 may be arranged on the second bonding pads BP2 and the fourth insulating layer 124, and the pad 480 may be electrically connected to the pad vias 139 and the pad wiring layer 138 in the third substrate SUB3 through the second bonding pads BP2.

In example embodiments, a metal layer 438 may be further arranged in the second through trench 120T among the plurality of through trenches 120T. The upper pad portions BP2U (see FIG. 9) of the second bonding pads BP2 may not be arranged in the through trenches 120T penetrating the second semiconductor substrate 120, but may be arranged under the metal layer 438 to be surrounded by the fourth insulating layer 124.

The metal layer 438 may include or may be formed of, but is not limited to, at least one of aluminum (Al), gold (Au), nickel (Ni), copper (Cu), tungsten (W), and titanium nitride (TiN). In some examples, the metal layer 438 may be formed of the same material as a material of the pad 480, and for example, the metal layer 438 may be formed in a process of forming the pad 480. However, the inventive concept is not limited thereto.

A buried insulating layer 424 may be further arranged in the third through trench among the plurality of through trenches 120T, and the buried insulating layer 424 may extend onto the second surface 120F2 (see FIG. 9) of the second semiconductor substrate 120, for example, between the second semiconductor substrate 120 and the fourth insulating layer 124. The third through trench may be arranged to surround each of the first through trench and the second through trench, when viewed in a plan view. For example, the third through trench may be arranged to surround the first through trench when viewed in a plan view and may electrically isolate the pad 480 in the first through trench from other regions of the second semiconductor substrate 120, and the third through trench may be arranged to surround the second through trench when viewed in a plan view and may electrically isolate the metal layer 438 in the second through trench and the second bonding pads BP2 connected to the metal layer 438 from other regions of the second semiconductor substrate 120. In some embodiments, the metal layer 438 and the second bonding pads BP2 may contact each other.

In example embodiments, the reflective metal layer 439 may be further arranged between the second through trench and the metal layer 438 and between the buried insulating layer 424 and the fourth insulating layer 124. In example embodiments, the reflective metal layer 439 may include or may be formed of at least one of tungsten (W), copper (Cu), and titanium nitride (TiN).

For example, the metal layer 438 and the reflective metal layer 439 may be used as a portion of a wiring layer, or may function as a shield that prevents photoelectrons generated in the plurality of pixels PX from penetrating into the logic transistors LCT in the third substrate SUB3 and then causing noise in the logic transistors LCT.

Figure 12:
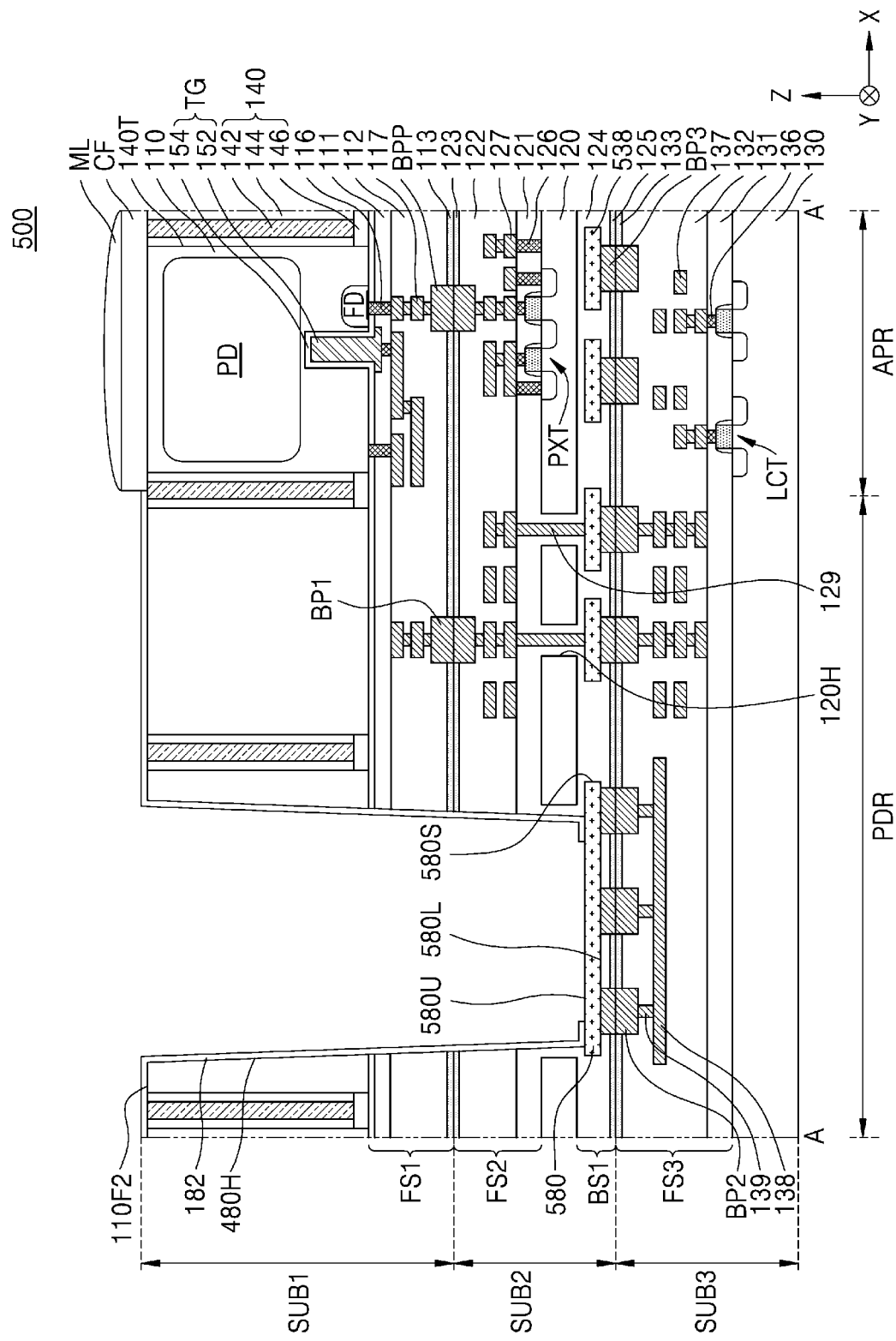
FIG. 12 is a cross-sectional view illustrating an image sensor, according to example embodiments.

FIG. 12 is a cross-sectional view illustrating an image sensor 500, according to example embodiments. In FIG. 12, the same reference numerals as those in FIGS. 1 to 11 denote the same elements.

Referring to FIG. 12, a pad opening 580H may penetrate the first semiconductor substrate 110, the first front structure FS1, the second front structure FS2, and the second semiconductor substrate 120, and may extend into the rear structure BS1.

A pad 580 may be arranged in the second substrate SUB2, for example, in the rear structure BS1. For example, side surfaces 580S of the pad 580 may be surrounded by the rear structure BS1, and a top surface 580U of the pad 580 may be exposed through a bottom portion of the pad opening 580H. A bottom surface 580L of the pad 580 may be arranged on the second bonding pads BP2 and the fourth insulating layer 124, and the pad 580 may be electrically connected to the pad vias 139 and the pad wiring layer 138 in the third substrate SUB3 through the second bonding pads BP2.

In example embodiments, the second bonding pads BP2 may not be arranged in the through holes 120H penetrating the second semiconductor substrate 120, but may be arranged to be surrounded by the fourth insulating layer 124. The pad vias 129 may be arranged in the through holes 120H penetrating the second semiconductor substrate 120, and may electrically connect the wiring layer 127 in the second front structure FS2 to the second bonding pads BP2.

Third bonding pads BP3 may be arranged at a lower level than a vertical level of the second semiconductor substrate 120 in the active pixel region APR. The third bonding pad BP3 may have the same structure as the second bonding pad BP2, except that the third bonding pad BP3 is arranged in the active pixel region APR.

In example embodiments, a metal layer 538 may be further arranged in the rear structure BS1. For example, the top surface of the metal layer 538 may be arranged at the same level as the top surface 580U of the pad 580, and the metal layer 538 may be arranged on the second bonding pads BP2 in the pad region PDR and/or on the third bonding pads BP3 in the active pixel region APR. For example, in the pad region PDR, the top surface of the metal layer 538 may be connected to the pad vias 129, and the bottom surface of the metal layer 538 may be connected to the second bonding pads BP2. In the active pixel region APR, the top surface of the metal layer 538 may be covered by the fourth insulating layer 124, and the bottom surface of the metal layer 538 may be connected to the third bonding pads BP3.

For example, the metal layer 538 may be used as a portion of a wiring layer, or may function as a shield that prevents photoelectrons generated in the plurality of pixels PX from penetrating into the logic transistors LCT in the third substrate SUB3 and then causing noise in the logic transistors LCT.

The metal layer 538 may include or may be formed of, but is not limited to, at least one of aluminum (Al), gold (Au), nickel (Ni), copper (Cu), tungsten (W), and titanium nitride (TiN). In some examples, the metal layer 538 may be formed of the same material as a material of the pad 580, and for example, the metal layer 538 may be formed in a process of forming the pad 580. However, the inventive concept is not limited thereto.

Figure 13:
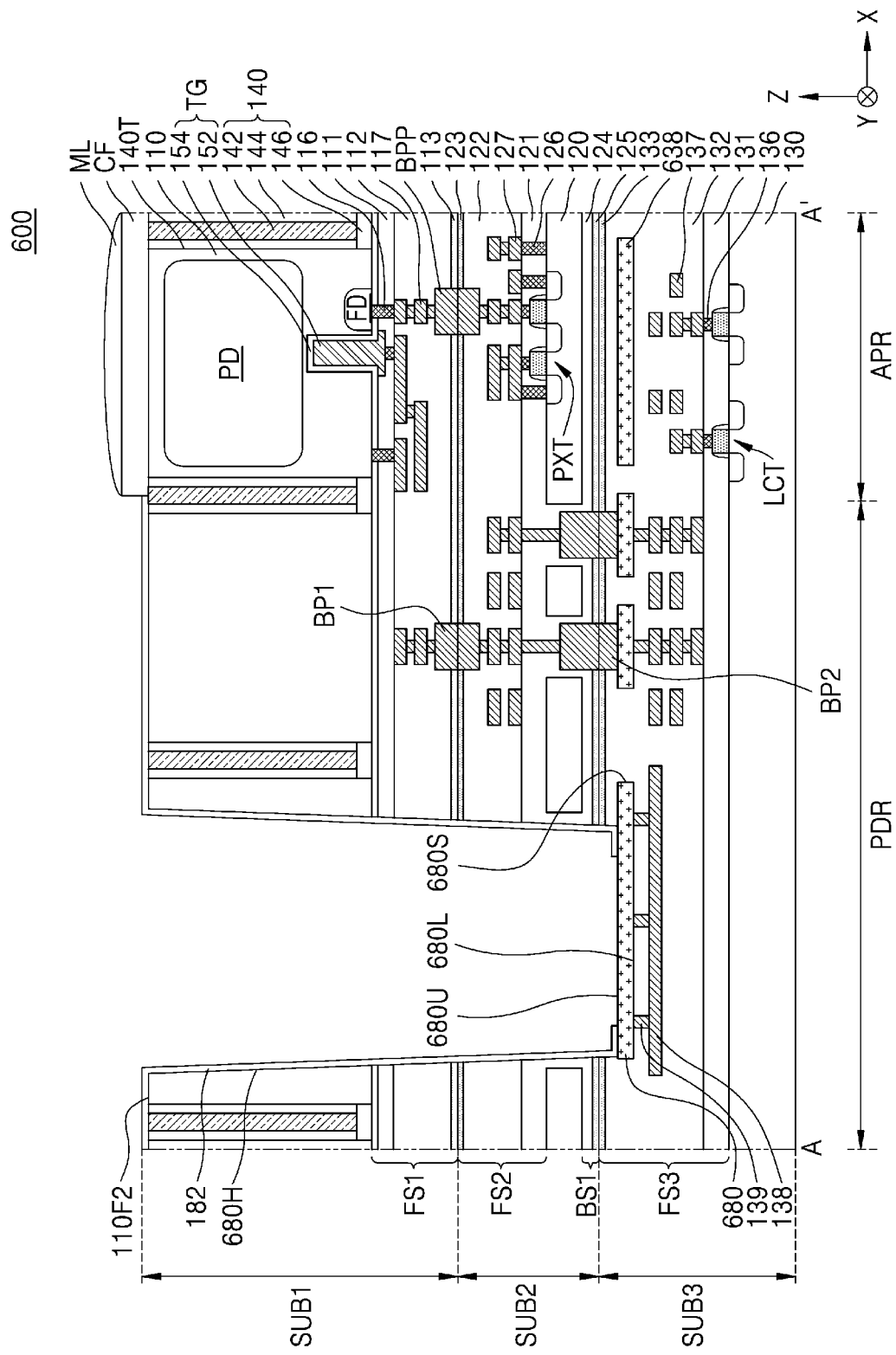
FIG. 13 is a cross-sectional view illustrating an image sensor, according to example embodiments.

FIG. 13 is a cross-sectional view illustrating an image sensor 600, according to example embodiments. In FIG. 13, the same reference numerals as those in FIGS. 1 to 12 denote the same elements.

Referring to FIG. 13, a pad opening 680H may penetrate the first semiconductor substrate 110, the first front structure FS1, the second front structure FS2, the second semiconductor substrate 120, and the rear structure BS1, and may extend into the third substrate SUB3. A pad 680 may be arranged in the third front structure FS3.

The pad 680 may be arranged in the third substrate SUB3, and for example, side surfaces 680S of the pad 680 may be surrounded by the third front structure FS3, and a top surface 680U of the pad 680 may be exposed through a bottom portion of the pad opening 680H. A bottom surface 680L of the pad 680 may be arranged on the pad vias 139 and the second insulating layer 132, and the pad 680 may be electrically connected to the pad wiring layer 138 through the pad vias 139.

In example embodiments, a metal layer 638 may be further arranged in the third front structure FS3. For example, the top surface of the metal layer 638 may be arranged at the same level as the top surface 680U of the pad 680, and the metal layer 638 may be arranged under the second bonding pads BP2 in the pad region PDR or in a region, which vertically overlaps the pixel gate PXT, in the active pixel region APR. The metal layer 638 may be used as a portion of a wiring layer, or may function as a shield that prevents photoelectrons generated in the plurality of pixels PX from penetrating into the logic transistors LCT in the third substrate SUB3 and then causing noise in the logic transistors LCT.

The metal layer 638 may include or may be formed of, but is not limited to, at least one of aluminum (Al), gold (Au), nickel (Ni), copper (Cu), tungsten (W), and titanium nitride (TiN). In some examples, the metal layer 638 may be formed of the same material as that of the pad 680, and for example, the metal layer 638 may be formed in a process of forming the pad 680. However, the inventive concept is not limited thereto.

FIGS. 14 to 24 are cross-sectional views illustrating a method of manufacturing the image sensor 100, according to example embodiments. FIG. 14 to FIG. 24 are cross-sectional views taken along line A-A' of FIG. 1.

Figure 14:
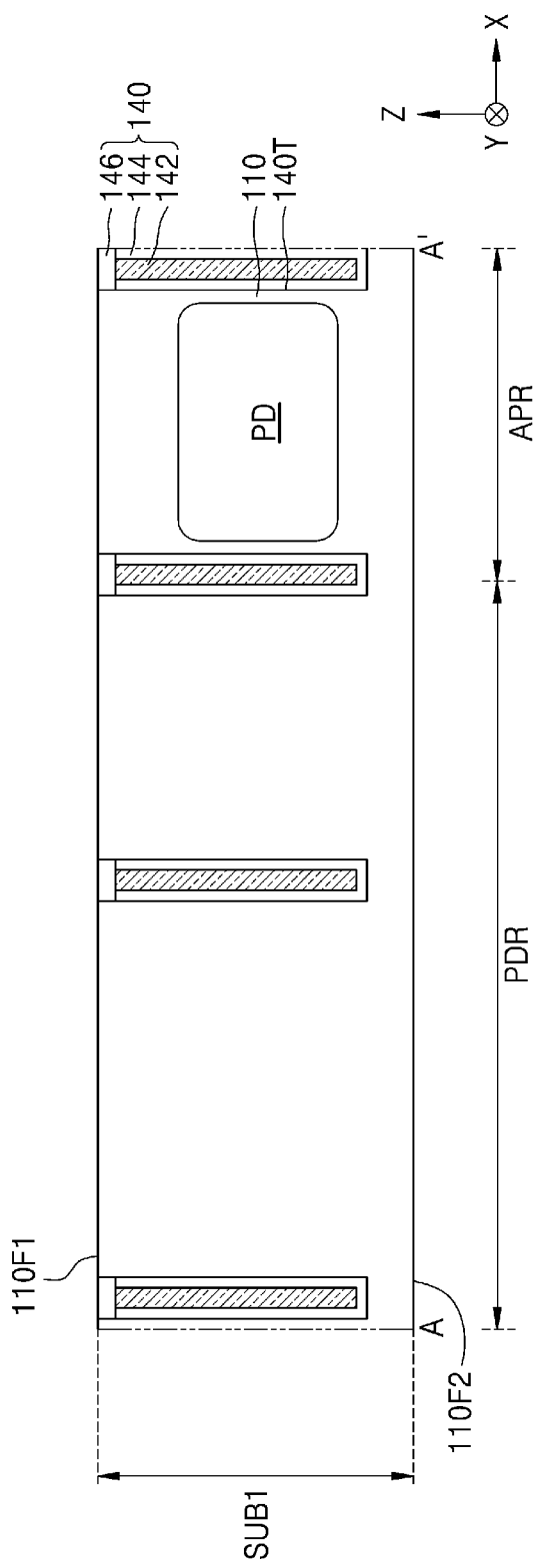
FIGS. 14 to 24 are cross-sectional views illustrating a method of manufacturing an image sensor, according to example embodiments.

Referring to FIG. 14, the first semiconductor substrate 110 including the first surface 110F1 and the second surface 110F2 opposite to each other is prepared.

The photoelectric conversion region PD may be formed from the first surface 110F1 of the first semiconductor substrate 110 by performing an ion implantation process. For example, the photoelectric conversion region PD may be formed by doping n-type impurities.

Thereafter, a mask pattern (not shown) may be formed on the first surface 110F1 of the first semiconductor substrate 110, and the pixel trench 140T may be formed in the first semiconductor substrate 110 by using the mask pattern as an etch mask. The pixel trench 140T may have a preset depth from the first surface 110F1 and may be formed in a matrix form when viewed in a plan view.

Thereafter, the insulating liner 144 may be conformally formed on an inner wall of the pixel trench 140T by performing a chemical vapor deposition (CVD) process or an atomic layer deposition (ALD) process. Thereafter, the conductive layer 142 may be formed on the insulating liner 144 to fill the inner wall of the pixel trench 140T. The conductive layer 142 may include or may be formed of at least one of doped polysilicon, metal, a metal silicide, a metal nitride, and a metal-containing layer.

Thereafter, an upper portion of the conductive layer 142 may be removed by performing an etch-back process such that the top surface of the conductive layer 142 is lower than the top surface of the first surface 110F1 of the first semiconductor substrate 110, an insulating layer (not shown) may be filled in the entrance of the pixel trench 140T, and then the insulating layer may be removed to expose the top surface of the first semiconductor substrate 110 such that the upper insulating layer 146 may remain in the entrance of the pixel trench 140T.

Figure 15:
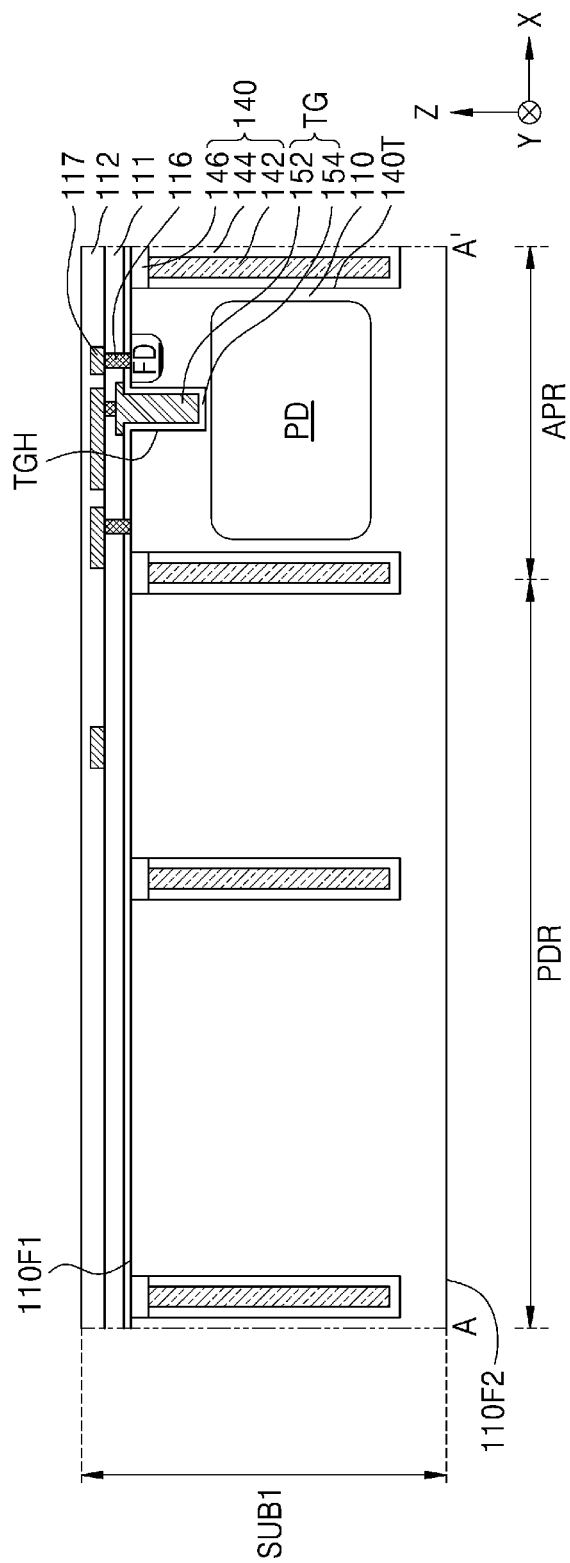

Referring to FIG. 15, a mask pattern (not shown) may be formed on the first surface 110F1 of the first semiconductor substrate 110, and the transfer gate trench TGH may be formed by removing a portion of the first semiconductor substrate 110 by using the mask pattern as an etch mask.

Thereafter, the buried transfer gate insulating layer 154 may be conformally formed on the first surface 110F1 of the first semiconductor substrate 110 and an inner wall of the transfer gate trench TGH. The transfer gate electrode 152 may be formed on the buried transfer gate insulating layer 154 to fill the transfer gate trench TGH. The transfer gate electrode 152 may be formed to have a thickness sufficiently large to completely fill the transfer gate trench TGH. In example embodiments, the transfer gate electrode 152 may be formed by using at least one of doped polysilicon, metal, a metal silicide, a metal nitride, and a metal-containing layer.

Thereafter, an ion implantation process may be performed on a portion of the first surface 110F1 of the first semiconductor substrate 110 to form the floating diffusion region FD.

The first insulating layer 111 may be formed on the first surface 110F1 of the first semiconductor substrate 110, and the conductive via 116 may be formed to penetrate the first insulating layer 111 and may be connected to the transfer gate electrode 152 and the floating diffusion region FD. The second insulating layer 112 may be formed on the first insulating layer 111 and the conductive via 116, and the wiring layer 117 may be formed to penetrate the second insulating layer 112 and be connected to the conductive via 116.

Figure 16:
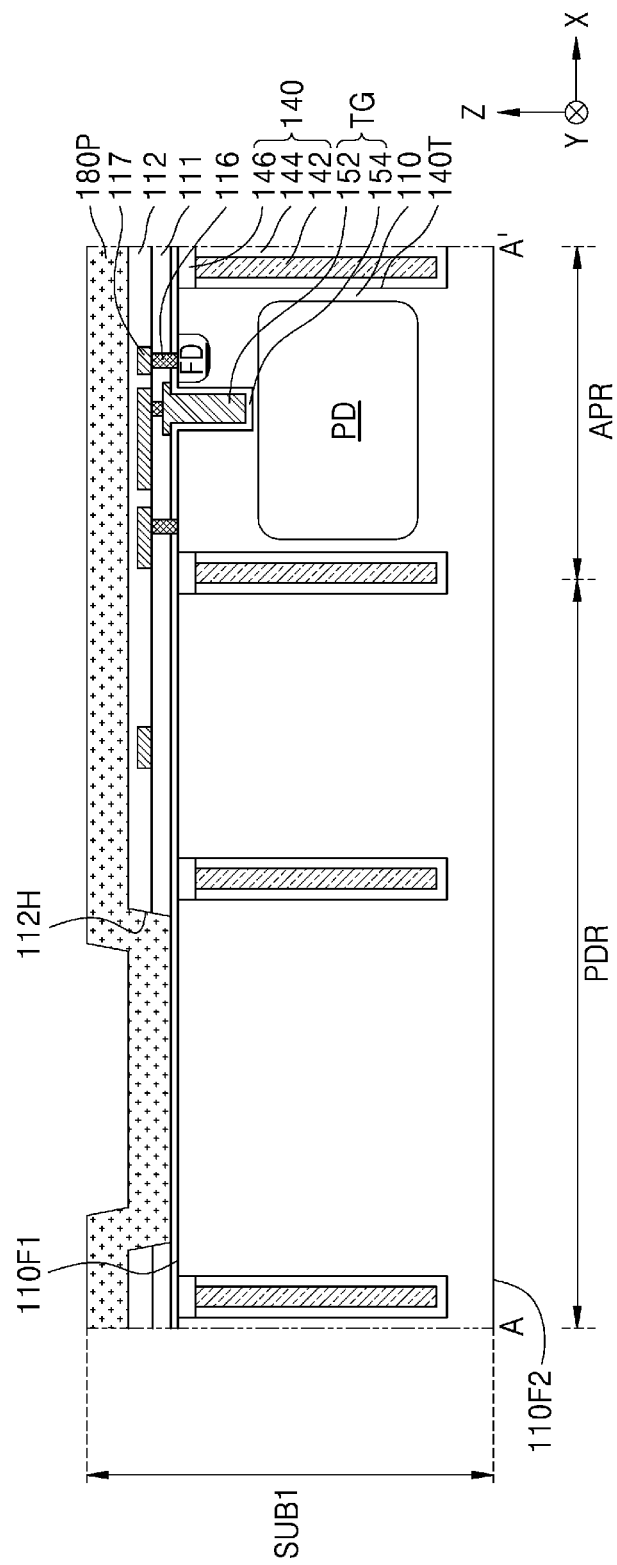

Referring to FIG. 16, an opening 112H may be formed to penetrate the first insulating layer 111 and the second insulating layer 112 in the pad region, and a preliminary pad layer 180P may be formed on the second insulating layer 112 to fill the inside of the opening 112H.

In example embodiments, the preliminary pad layer 180P may be formed by using at least one of aluminum (Al), gold (Au), nickel (Ni), copper (Cu), tungsten (W), and titanium nitride (TiN). In some examples, the preliminary pad layer 180P may be formed in a three-layer structure including a barrier layer (not shown), which is conformally formed on an inner wall of the opening 112H and includes or is formed of titanium nitride (TiN), a pad layer (not shown), which fills the inside of the opening 112H on the barrier layer and includes or is formed of aluminum (Al), and another barrier layer (not shown), which is arranged on the top surface of the pad layer and includes or is formed of titanium nitride (TiN).

Figure 17:
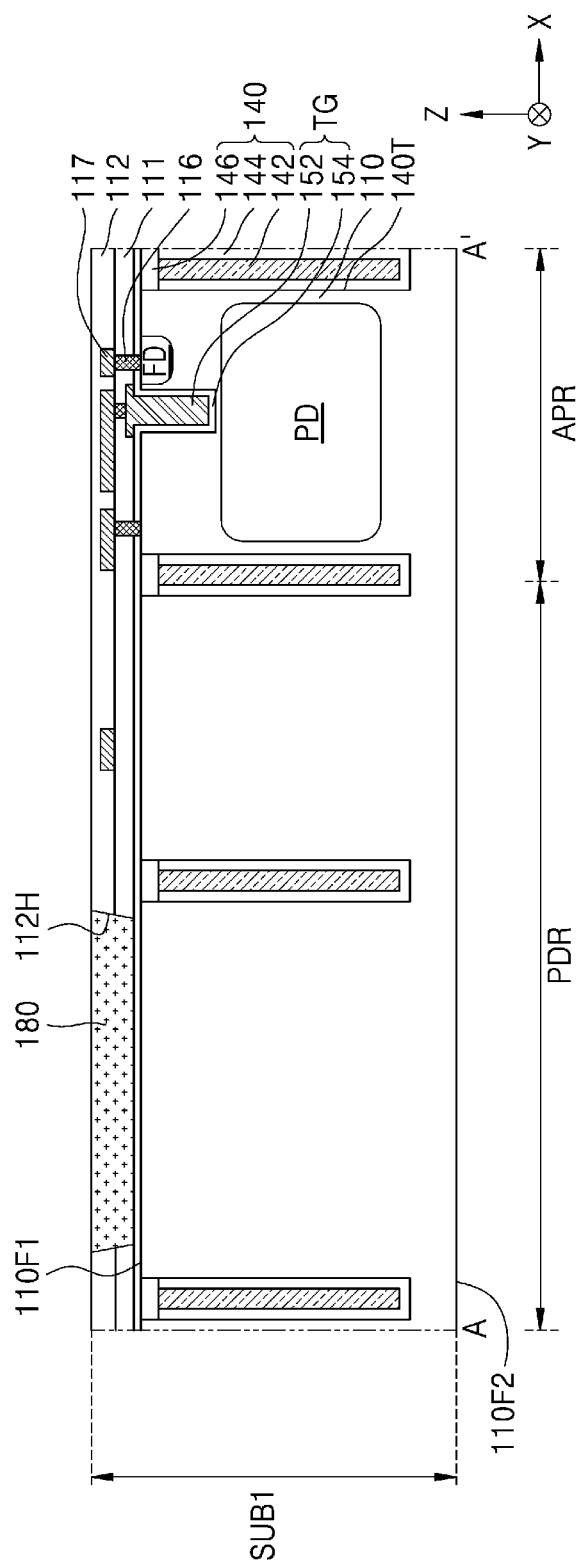

Referring to FIG. 17, the top surface of the preliminary pad layer 180P may be etched back or planarized to expose the top surface of the second insulating layer 112, such that the pad 180 remains in the opening 112H.

As illustrated in FIG. 17, in a process of forming the opening 112H, an upper portion of the opening 112H may be formed to have a width greater than a width of a bottom portion of the opening 112H, and the pad 180 filling the opening 112H may have inclined sidewalls such that the width of the opening 112H increases away from the first surface 110F1 of the first semiconductor substrate 110, but the inventive concept is not limited thereto.

Figure 18:
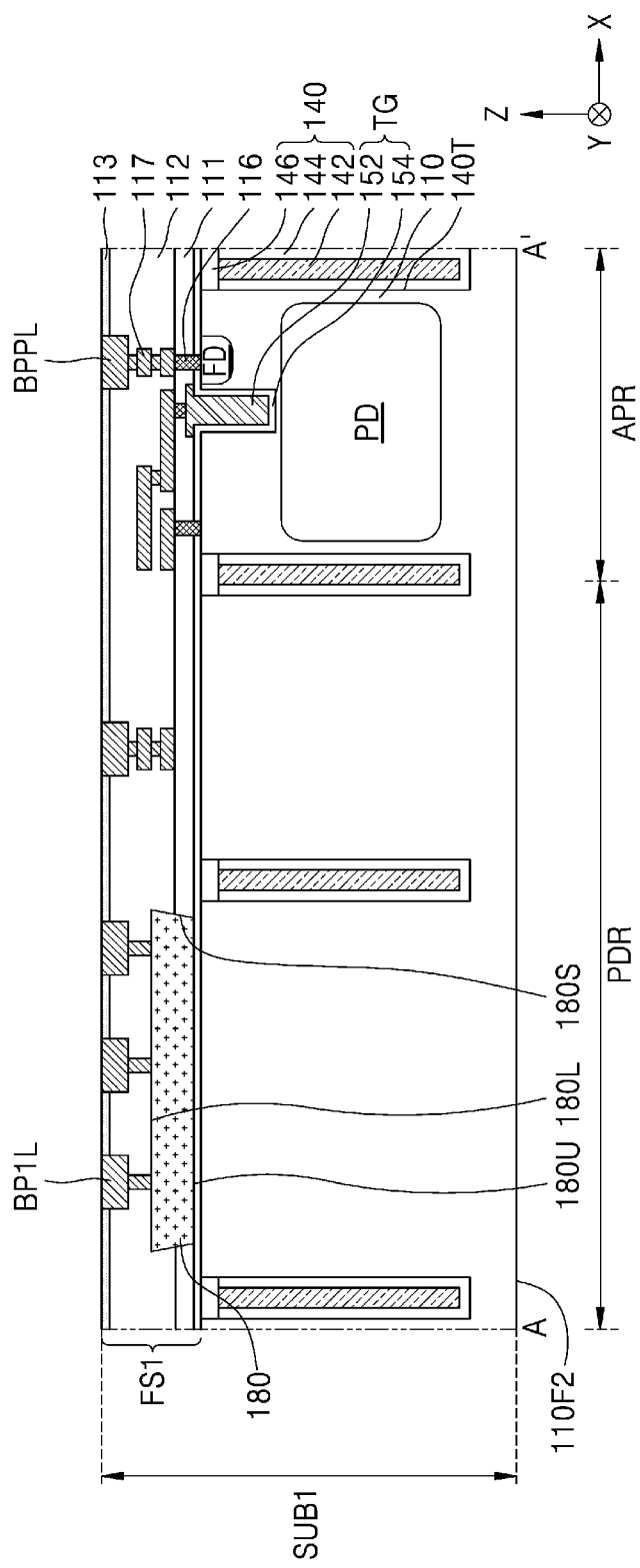

Referring to FIG. 18, an additional insulating layer (not shown) and the additional wiring layer 117 may be formed to cover the pad 180. A plurality of wiring layers 117 arranged at different levels, and the second insulating layer 112 covering the plurality of wiring layers 117 and the pad 180 may be formed.

The third insulating layer 113 may be formed on the second insulating layer 112. The third insulating layer 113 may be formed by using silicon oxide, silicon nitride, silicon oxynitride, or silicon carbon nitride.

Thereafter, a mask pattern (not shown) may be formed on the third insulating layer 113, the bonding pad opening BPH (see FIG. 3) may be formed by removing portions of the third insulating layer 113 and the second insulating layer 112 by using the mask pattern as an etch mask, and the lower pad portions BP1L of the first bonding pads BP1 and the lower pad portion BPPL of the pixel bonding pad BPP may be formed in the bonding pad opening BPH.

In example embodiments, the barrier layer 162 (see FIG. 3) may be first formed on an inner wall of the bonding pad opening BPH in order to form the lower pad portions BP1L of the first bonding pads BP1 and the lower pad portion BPPL of the pixel bonding pad BPP, then the metal layer 164 may be formed on the barrier layer 162 to a thickness sufficient to fill the bonding pad opening BPH, then an upper portion of the metal layer 164 may be planarized to expose the top surface of the third insulating layer 113, and thus the metal layer 164 may remain in the bonding pad opening BPH. For example, the top surfaces of the lower pad portion BP1L of the first bonding pad BP1 and the lower pad portion BPPL of the pixel bonding pad BPP may be arranged at the same level as the top surface of the third insulating layer 113.

In example embodiments, the lower pad portion BP1L of the first bonding pad BP1 may be arranged to be electrically connected to the pad 180 and the wiring layer 117 in the pad region PDR. In the active pixel region APR, the lower pad portion BPPL of the pixel bonding pad BPP may be electrically connected to the wiring layer 117, which is connected to the floating diffusion region FD and/or the transfer gate TG.

Figure 19:
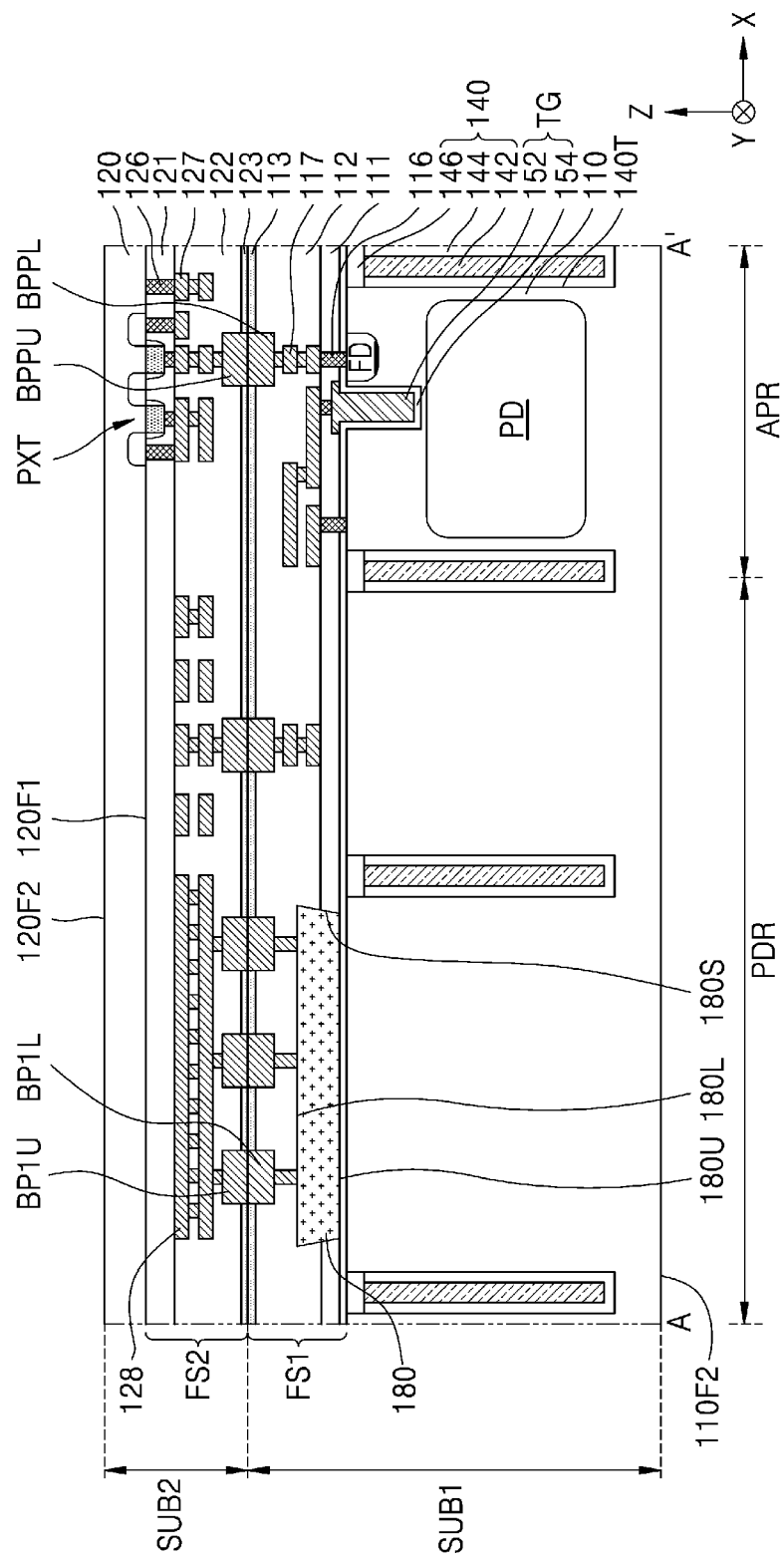

Referring to FIG. 19, the pixel gate PXT may be formed on the second semiconductor substrate 120 in the active pixel region APR. As illustrated in FIG. 3, the pixel gate PXT may include the gate insulating layer 172, the gate electrode 174, and the spacer 176.

Thereafter, the first insulating layer 121, which covers the pixel gate PXT, and the conductive via 126, which penetrates the first insulating layer 121 and is electrically connected to the pixel gate PXT, may be formed on the second semiconductor substrate 120. The wiring layer 127, the second insulating layer 122, and the third insulating layer 123 may be formed on the first insulating layer 121.

Thereafter, the bonding pad opening BPH (see FIG. 3) may be formed by removing portions of the second insulating layer 122 and the third insulating layer 123, and the upper pad portion BP1U of the first bonding pad BP1 and the upper pad portion BPPU of the pixel bonding pad BPP may be formed in the bonding pad opening BPH. A method of forming the lower pad portion BP1L of the first bonding pad BP1 and the lower pad portion BPPL of the pixel bonding pad BPP may be similar to a method of forming the lower pad portion BP1L of the first bonding pad BP1 and the lower pad portion BPPL of the pixel bonding pad BPP.

Thereafter, the second substrate SUB2 may be attached to the first substrate SUB1 by performing a high-temperature heat treatment in a state in which the upper pad portions BP1U of the first bonding pads BP1 are arranged on the lower pad portions BP1L of the first bonding pads BP1, the upper pad portion BPPU of the pixel bonding pad BPP is arranged on the lower pad portion BPPL of the pixel bonding pad BPP, and the third insulating layer 123 in the second front structure FS2 is in contact with the third insulating layer 113 in the first front structure FS1.

When performing the heat treatment, by the interdiffusion of metal atoms, the upper pad portion BP1U and the lower pad portion BP1L of the first bonding pad BP1 may be bonded with each other, and the upper pad portion BPPU and the lower pad portion BPPL of the pixel bonding pad BPP may be bonded with each other. When performing the heat treatment, the top surface of the third insulating layer 113 and the top surface of the third insulating layer 123 may be bonded with each other, and accordingly, the first substrate SUB1 and the second substrate SUB2 may be bonded with each other in a metal-oxide hybrid bonding manner.

Thereafter, the second semiconductor substrate 120 may be thinned by removing a portion of the second semiconductor substrate 120 from the second surface 110F2 of the second semiconductor substrate 120 by performing a grinding process.

Figure 20:
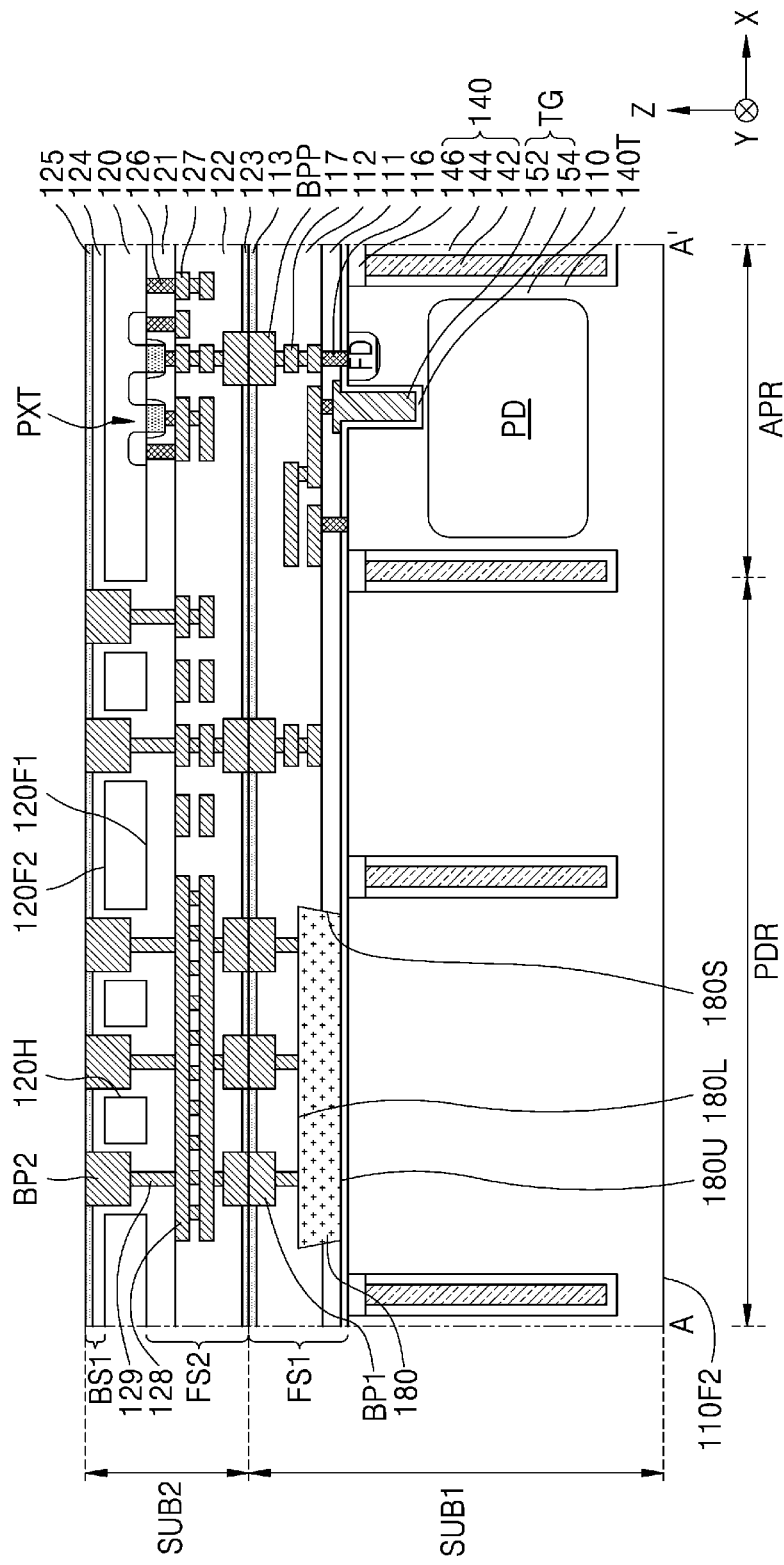

Referring to FIG. 20, the plurality of second through holes 120H may be formed to penetrate the second semiconductor substrate 120. Thereafter, the fourth insulating layer 124 may be formed in the plurality of second through holes 120H and on the second surface 120F2 of the second semiconductor substrate 120, and the pad vias 129 may be formed to penetrate the fourth insulating layer 124 and the first insulating layer 121 and be electrically connected to the wiring layer 127 and the pad wiring layer 128 in the second front structure FS2. Thereafter, the fifth insulating layer 125 may be formed on the fourth insulating layer 124, and the lower pad portion BP2L of the second bonding pad BP2 may be formed in the fifth insulating layer 125 and the fourth insulating layer 124.

Figure 21:
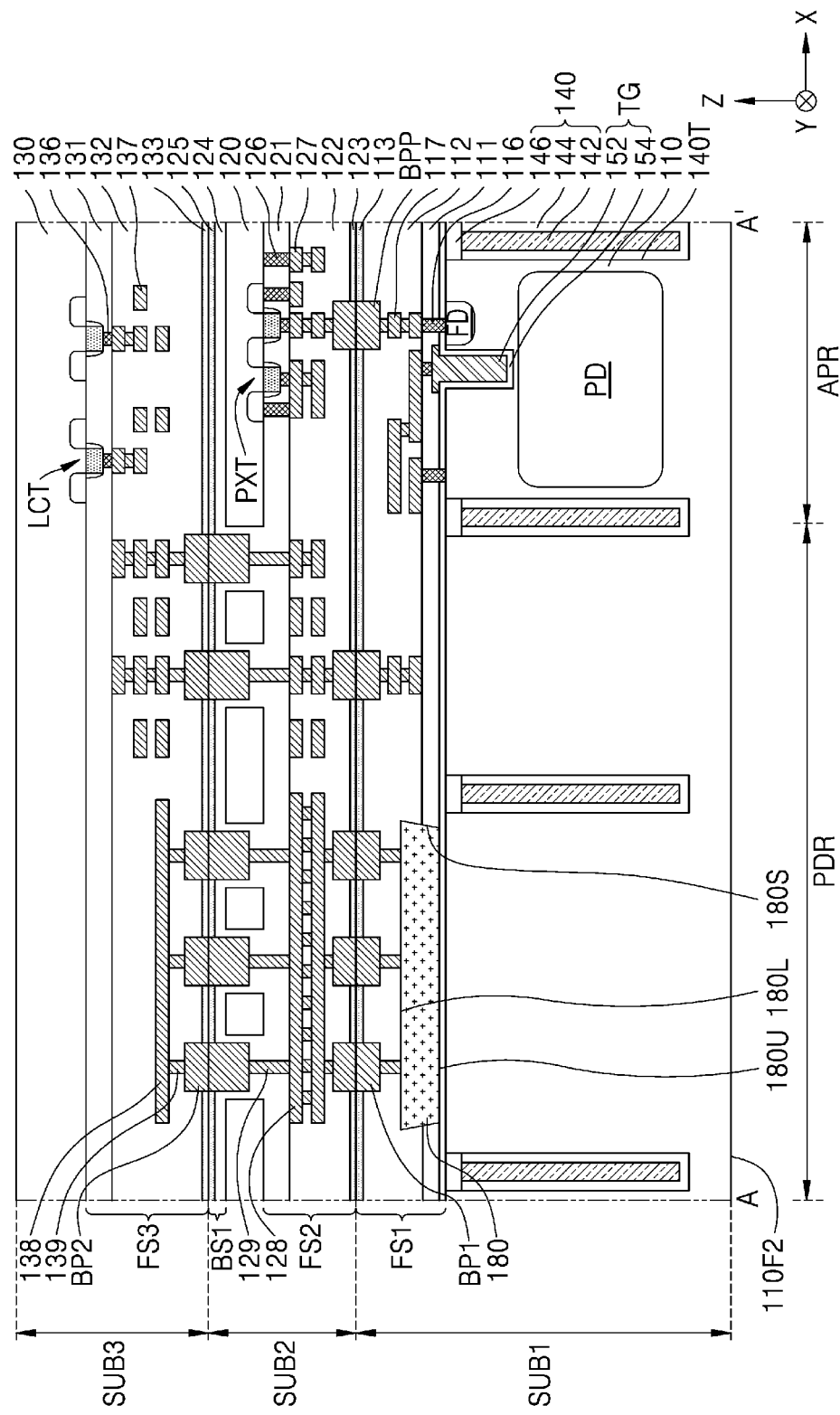

Referring to FIG. 21, the logic transistors LCT may be formed on the third semiconductor substrate 130, and the third front structure FS3 may be formed to cover the logic transistors LCT. The third front structure FS3 may include the first insulating layer 131, the second insulating layer 132, the third insulating layer 133, the conductive via 136, the wiring layer 137, the pad wiring layer 138, the pad vias 139, and the upper pad portions BP2U of the second bonding pads BP2.

Thereafter, the third substrate SUB3 may be attached to the second substrate SUB2 by performing a high-temperature heat treatment in a state in which the upper pad portions BP2U of the second bonding pads BP2 are arranged on the lower pad portions BP2L of the second bonding pads BP2, and the third insulating layer 133 in the third front structure FS3 is in contact with the fifth insulating layer 125 in the rear structure BS1.

Figure 22:
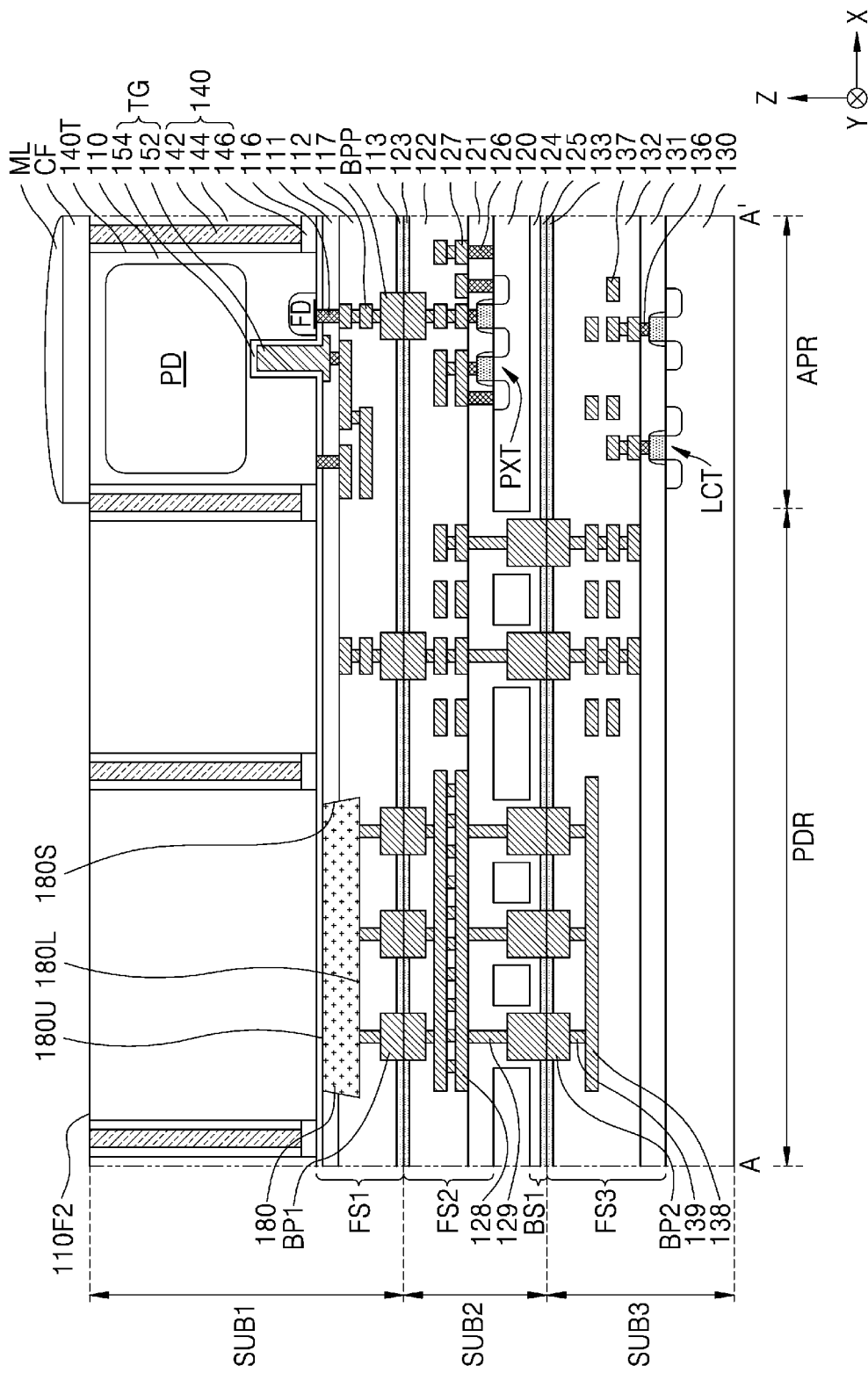

Referring to FIG. 22, the stack structure illustrated in FIG. 21 may be turned upside down such that the second surface 110F2 of the first semiconductor substrate 110 faces upward. Thereafter, a portion of the first semiconductor substrate 110 may be removed from the second surface 110F2 of the first semiconductor substrate 110 by performing a planarization process, such as chemical-mechanical polishing (CMP) or etch-back, to expose the top surfaces of the pixel isolation structures 140 (e.g., end portions adjacent to the second surface 110F2 of the first semiconductor substrate 110).

Although not shown, a rear insulating layer (not shown) may be formed on the second surface 110F2 of the first semiconductor substrate 110. The rear insulating layer may include or may be formed of metal oxide and may function as a negative charge fixing layer.

Thereafter, the color filter CF and the microlens ML may be formed on the second surface 110F2 of the first semiconductor substrate 110 in the active pixel region APR.

For example, a coating process may be performed to form the color filter CF, and because the second surface 110F2 of the first semiconductor substrate 110 has a flat top surface level (for example, the second surface 110F2 of the first semiconductor substrate 110 does not have a significant level difference), process defects such as coating defects may be prevented. A photoresist pattern may be formed on the second surface 110F2 of the first semiconductor substrate 110 in order to form the microlens ML, and because the second surface 110F2 of the first semiconductor substrate 110 has a flat top surface level, process defects such as focusing defects may be prevented in a process of forming the photoresist pattern.

Figure 23:
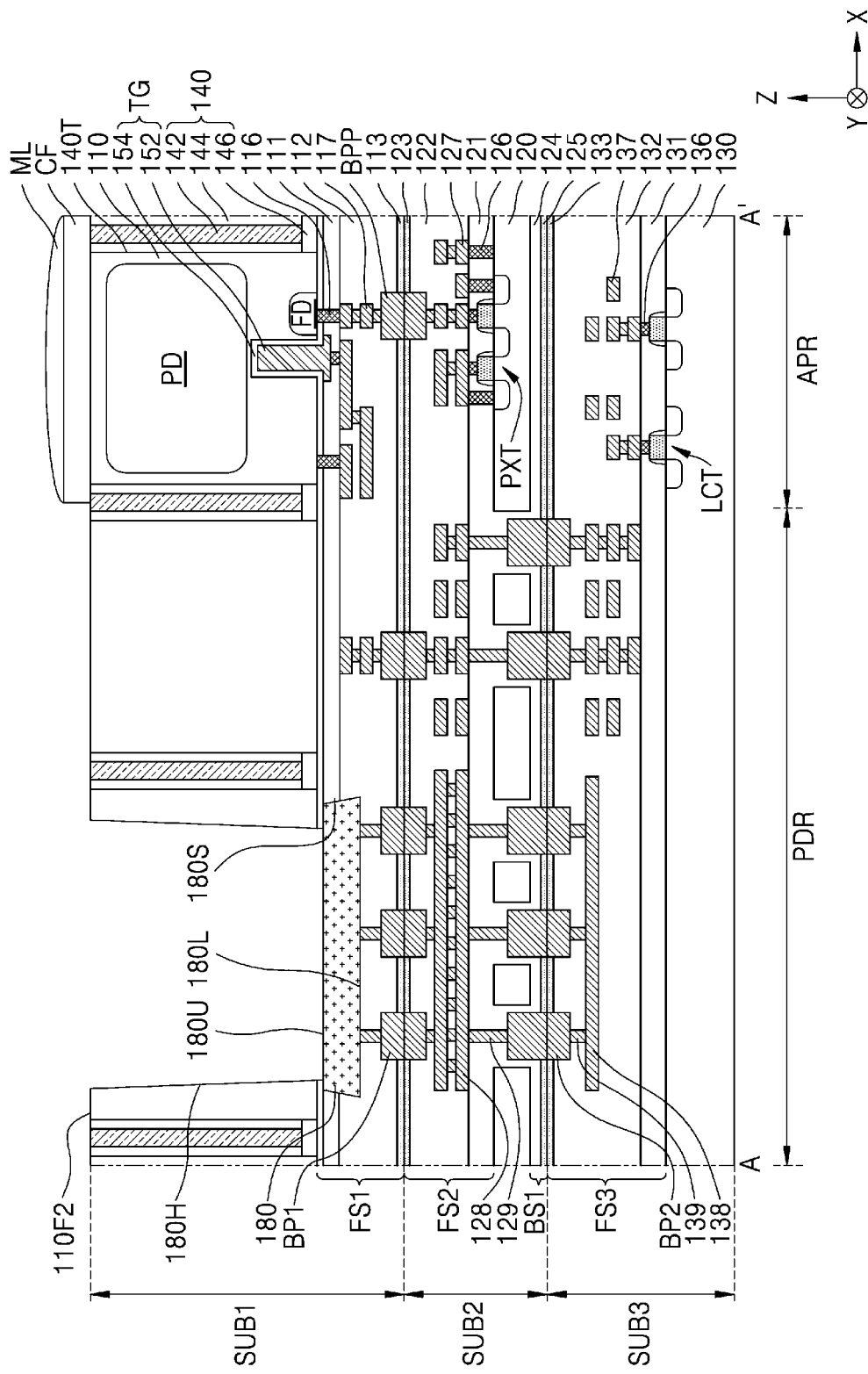

Referring to FIG. 23, the pad opening 180H may be formed to penetrate the first semiconductor substrate 110 in the pad region PDR. The top surface 180U of the pad 180 may be exposed by the bottom portion of the pad opening 180H.

As illustrated in FIG. 23, the width of the bottom portion of the pad opening 180H may be less than the width of the top surface 180U of the pad 180 such that the pad opening 180H does not expose the edge of the top surface 180U of the pad 180. Accordingly, undesired impurities, ions, and the like may be prevented from penetrating into the first front structure FS1 from the pad opening 180H. However, the inventive concept is not limited thereto.

Figure 24:
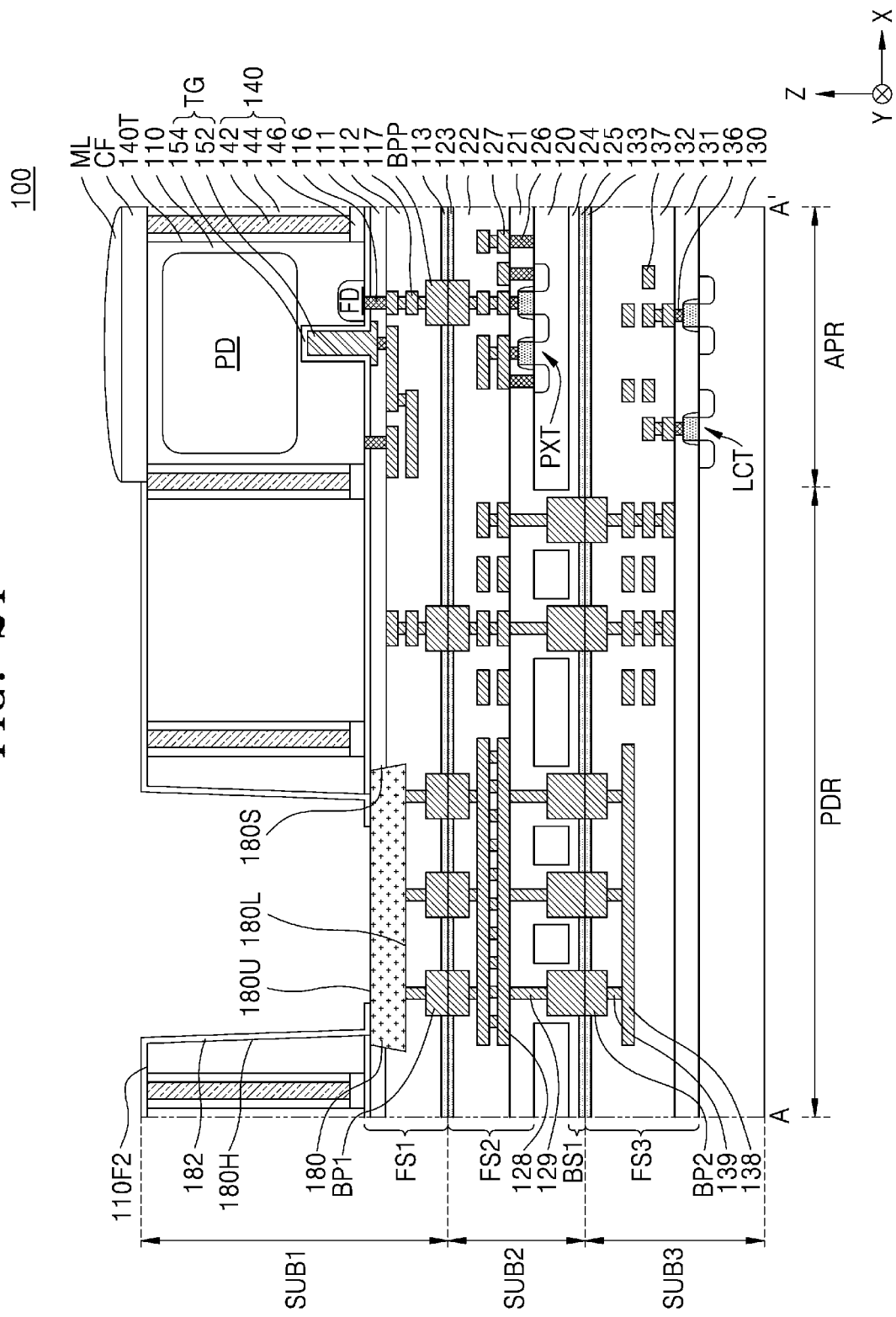

Referring to FIG. 24, the passivation layer 182 may be formed on the second surface 110F2 of the first semiconductor substrate 110 and on an inner wall of the pad opening 180H. The passivation layer 182 may extend onto the top surface 180U of the pad 180, but may not cover a central portion of the top surface 180U of the pad 180.

The image sensor 100 may be manufactured through the above-described processes.

According to an image sensor of a comparative example, a pad may be formed on the second surface 110F2 of the first semiconductor substrate 110 to have a relatively large thickness or may be arranged in a pad recess having a preset depth from the second surface 110F2 of the first semiconductor substrate 110, and a through silicon via (not shown) for electrically connecting the pad to the second semiconductor substrate 120 may be arranged in a pad region. The through silicon via and the pad are formed before the color filter CF and the microlens ML are formed on the second surface 110F2 of the first semiconductor substrate 110. An etching process for forming the through silicon via may cause etching damage on the pad wiring layer 128 or the pad vias 129 connected to a lower portion of the through silicon via. Due to a relatively large level difference caused by the pad, a process defect may occur in a process of coating the color filter CF, or a photoresist patterning defect may occur in a process of forming the microlens ML.

However, according to the above-described example embodiments, the pad 180 may be formed to be surrounded by the first front structure FS1 of the first substrate SUB1 when forming the first front structure FS1 of the first substrate SUB1, then the pad opening 180H may be formed after forming the color filter CF and the microlens ML, and accordingly, the pad 180 may be exposed to the outside and may connected to the outside without using a through silicon via. Therefore, because it is unnecessary to form a through silicon via, defects that may be caused by etching damage to the pad wiring layer 128 may be prevented. Because the second surface 110F2 has a flat top surface level when forming the color filter CF and the microlens ML, coating defects of the color filter CF and/or patterning defects of the microlens ML may be prevented.

Figure 25:
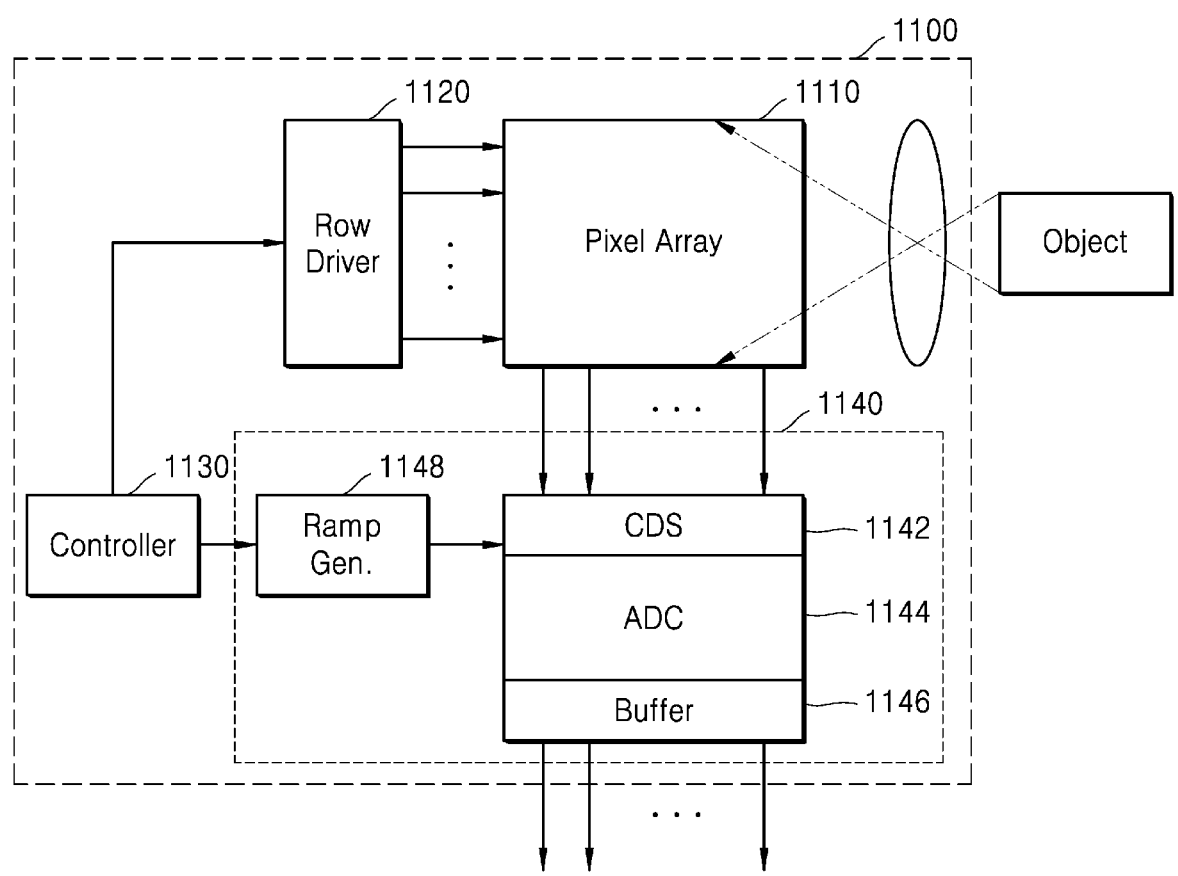
FIG. 25 is a block diagram illustrating a configuration of an image sensor, according to an example embodiment.

FIG. 25 is a block diagram illustrating a configuration of an image sensor 1100, according to an example embodiment.

Referring to FIG. 25, the image sensor 1100 may include a pixel array 1110, a controller 1130, a row driver 1120, and a pixel signal processor 1140. The image sensor 1100 includes at least one of the image sensors 100, 200, 300, 400, 500, and 600, which are described with reference to FIGS. 1 to 13.

The pixel array 1110 may include a plurality of unit pixels that are two-dimensionally arranged, and each unit pixel may include a photoelectric conversion device. The photoelectric conversion device may absorb light and generate electric charges therefrom, and an electrical signal (an output voltage) according to the generated electric charges may be provided to the pixel signal processor 1140 through a vertical signal line. The unit pixels included in the pixel array 1110 may provide the output voltage one at a time in row units, and accordingly, the unit pixels belonging to one row of the pixel array 1110 may be simultaneously activated by a selection signal output by the row driver 1120. The unit pixels included in a selected row may provide an output line of a corresponding column with the output voltage according to the absorbed light.

The controller 1130 may control the row driver 1120 to cause the pixel array 1110 to absorb light to accumulate electric charges or temporarily store the accumulated electric charges and output an electrical signal according to the stored electric charges to the outside of the pixel array 1110. The controller 1130 may also control the pixel signal processor 1140 to measure the output voltage provided by the pixel array 1110.

The pixel signal processor 1140 may include a CDS 1142, an analog-to-digital converter (ADC) 1144, and a buffer 1146. The CDS 1142 may sample and hold the output voltage provided by the pixel array 1110. The CDS 1142 may double-sample a certain noise level and a level of the generated output voltage, and may output a level corresponding to a difference therebetween. The CDS 1142 may receive ramp signals generated by a ramp signal generator 1148, compare the ramp signals with each other, and output a result of the comparison.

The ADC 1144 may convert an analog signal corresponding to the level received from the CDS 1142 into a digital signal. The buffer 1146 may latch the digital signal, and the latched signal may be sequentially output to the outside of the image sensor 1100 and transferred to an image processor (not shown).

While the inventive concept has been particularly shown and described with reference to embodiments thereof, it will be understood that various changes in form and details may be made therein without departing from the spirit and scope of the following claims.

What is claimed is:

1. An image sensor comprising:
a stack structure comprising an active pixel region in which a plurality of pixels are defined, and a pad region arranged on at least one side of the active pixel region,
wherein each of the plurality of pixels includes a photoelectric conversion region and a floating diffusion region,
wherein the stack structure comprises:
a first substrate comprising:
a first semiconductor substrate at which the photoelectric conversion region and the floating diffusion region in each of the plurality of pixels are disposed, the first semiconductor substrate comprising a first surface and a second surface,
a first front structure arranged on the first surface of the first semiconductor substrate, and
a pad opening penetrating the first semiconductor substrate in the pad region;
a second substrate attached to the first substrate and comprising a plurality of pixel gates, each of the plurality of pixel gates being electrically connected to a floating diffusion region in a corresponding pixel of the plurality of pixels;
a third substrate attached to the second substrate and comprising a logic transistor for driving the plurality of pixels; and
a pad having a top surface that is exposed through the pad opening, and
wherein the top surface of the pad is arranged at a lower vertical level than the first surface of the first semiconductor substrate and at a higher vertical level than a bottom surface of the third substrate.

2. The image sensor of claim 1,
wherein the second substrate further comprises:
a second semiconductor substrate; and
a second front structure arranged on the second semiconductor substrate, and
wherein the first front structure and the second front structure are attached with each other by a plurality of first bonding pads and a plurality of pixel bonding pads.

3. The image sensor of claim 2,
wherein the plurality of pixel bonding pads are arranged in the plurality of pixels, respectively, and
wherein the floating diffusion region, in the first substrate, of each of the plurality of pixels is electrically connected to a corresponding pixel gate of the plurality of pixel gates in the second substrate by a corresponding pixel bonding pad of the plurality of pixel bonding pads.

4. The image sensor of claim 2,
wherein the first substrate further comprises:
a transfer gate arranged on the first surface of the first semiconductor substrate; and
a color filter and a microlens arranged on the second surface of the first semiconductor substrate opposite to the first surface of the first semiconductor substrate,
wherein each of the plurality of pixel gates is a source follower gate on a first surface of the second semiconductor substrate, and
wherein the first surface of the second semiconductor substrate is closer to the second surface of the first semiconductor substrate than the first surface of the first semiconductor substrate.

5. The image sensor of claim 2,
wherein a sidewall of the pad is surrounded by at least one insulating layer of the first front structure, and
wherein the top surface of the pad is arranged at a higher vertical level than an interface between the first front structure and the second front structure, with respect to a top surface of the third substrate.

6. The image sensor of claim 2,
wherein an edge of the top surface of the pad is covered by the first semiconductor substrate.

7. The image sensor of claim 2,
wherein the top surface of the pad has a first width in a first direction parallel to a top surface of the third substrate, and
wherein a bottom surface of the pad has a second width in the first direction, the second width being greater than the first width.

8. The image sensor of claim 7,
wherein the pad opening has a third width in the first direction at a bottom portion, the third width being less than the first width of a top surface of the pad.

9. The image sensor of claim 2,
wherein the pad opening penetrates the first semiconductor substrate and the first front structure, and
wherein a sidewall of the pad is surrounded by the second front structure.

10. The image sensor of claim 2,
wherein the pad opening penetrates the first semiconductor substrate, the first front structure, and the second front structure, and
wherein a sidewall of the pad is surrounded by the second semiconductor substrate.

11. The image sensor of claim 2,
wherein the second substrate further comprises a rear structure, which is arranged on the second semiconductor substrate and opposite to the second front structure,
wherein the third substrate comprises:
a third semiconductor substrate, and
a third front structure arranged on the third semiconductor substrate, and
wherein the rear structure and the third front structure are attached to each other by a plurality of second bonding pads.

12. The image sensor of claim 11,
wherein the pad opening penetrates the first semiconductor substrate, the first front structure, the second front structure, and the second semiconductor substrate, and
wherein a sidewall of the pad is surrounded by the third front structure.

13. An image sensor comprising:
a stack structure comprising:
an active pixel region in which a plurality of pixels are defined, and
a pad region arranged on at least one side of the active pixel region,
wherein each of the plurality of pixels includes a photoelectric conversion region and a floating diffusion region,
wherein the stack structure comprises:
a first substrate comprising:
a first semiconductor substrate comprising a first surface and a second surface, the photoelectric conversion region and the floating diffusion region in each pixel of the plurality of pixels being disposed at the first semiconductor substrate,
a first front structure arranged on the first surface of the first semiconductor substrate, and
a pad opening penetrating the first semiconductor substrate in the pad region;
a second substrate attached to the first front structure of the first substrate and comprising a plurality of pixel gates, each of the plurality of pixel gates being electrically connected to a floating diffusion region in a corresponding pixel of the plurality of pixels;
a third substrate attached to the second substrate and comprising a logic transistor for driving the plurality of pixels; and
a pad having a top surface exposed through the pad opening in the pad region,
wherein the first surface of the first semiconductor substrate is positioned closer to the second substrate than the second surface of the first semiconductor substrate, and
wherein the top surface of the pad is arranged at a level lower than the first surface of the first semiconductor substrate.

14. The image sensor of claim 13,
wherein a sidewall of the pad is surrounded by the first front structure, and
wherein an edge of the top surface of the pad is covered by the first semiconductor substrate.

15. The image sensor of claim 13,
wherein the top surface of the pad has a first width in a first direction parallel to a top surface of the third substrate,
wherein a bottom surface of the pad has a second width in the first direction, the second width being greater than the first width, and
wherein the pad opening has a third width in the first direction at a bottom portion, the third width being less than the first width of the top surface of the pad.

16. The image sensor of claim 13,
wherein the second substrate further comprises:
a second semiconductor substrate; and
a second front structure arranged on the second semiconductor substrate,
wherein the first front structure and the second front structure are attached with each other by a plurality of first bonding pads and a plurality of pixel bonding pads,
wherein the plurality of pixel bonding pads are arranged in the plurality of pixels, respectively, and
wherein the floating diffusion region, in the first substrate, of each pixel of the plurality of pixels is electrically connected to a corresponding pixel gate of the plurality of pixel gates in the second substrate by a corresponding pixel bonding pad of the plurality of pixel bonding pads.

17. The image sensor of claim 16,
wherein the pad opening penetrates the first semiconductor substrate and the first front structure,
wherein a sidewall of the pad is surrounded by the second front structure,
wherein the top surface of the pad has a first width in a first direction parallel to a top surface of the third substrate, and
wherein a bottom surface of the pad has a second width in the first direction, the second width being less than the first width.

18. The image sensor of claim 16,
wherein the second substrate further comprises a rear structure, which is arranged on the second semiconductor substrate and opposite to the second front structure,
wherein the third substrate comprises:
a third semiconductor substrate; and
a third front structure arranged on the third semiconductor substrate, and
wherein the rear structure and the third front structure are attached with each other by a plurality of second bonding pads.

19. The image sensor of claim 18,
wherein the pad opening penetrates the first semiconductor substrate, the first front structure, the second front structure, and the second semiconductor substrate,
wherein a sidewall of the pad is surrounded by the third front structure,
wherein the top surface of the pad has a first width in a first direction parallel to a top surface of the third substrate, and
wherein a bottom surface of the pad has a second width in the first direction, the second width being less than the first width.

20. An image sensor comprising:
a stack structure comprising an active pixel region in which a plurality of pixels are defined; and
a pad region arranged on at least one side of the active pixel region,
wherein the stack structure comprises:
a first substrate, a second substrate, and a third substrate, which are stacked in a vertical direction; and
a pad arranged in the pad region,
wherein the first substrate comprises a first semiconductor substrate and a first front structure arranged on the first semiconductor substrate,
wherein the first semiconductor substrate comprises a photoelectric conversion region and a floating diffusion region, which are in each of the plurality of pixels,
wherein the second substrate comprises a second semiconductor substrate and a second front structure arranged on the second semiconductor substrate,
wherein the second front structure is in contact with the first front structure,
wherein the second substrate comprises a plurality of pixel gates, each of the plurality of pixel gates being electrically connected to a floating diffusion region in a corresponding pixel of the plurality of pixels,
wherein the third substrate comprises a third semiconductor substrate and a third front structure arranged on the third semiconductor substrate,
wherein the third substrate comprises a logic transistor for driving the plurality of pixels, and
wherein the pad has a top surface that is exposed through a pad opening penetrating the first substrate, and a sidewall that is surrounded by the first front structure.

* * * * *